US012592192B2

(12) United States Patent
Li et al.

(10) Patent No.: US 12,592,192 B2
(45) Date of Patent: Mar. 31, 2026

(54) DISPLAY PANEL AND DISPLAY DEVICE

(71) Applicants: Fuzhou BOE Optoelectronics Technology Co., Ltd., Fujian (CN); BOE Technology Group Co., Ltd., Beijing (CN)

(72) Inventors: Zongxiang Li, Beijing (CN); Yao Liu, Beijing (CN); Liqing Yao, Beijing (CN); Yaochao Lv, Beijing (CN); Xi Chen, Beijing (CN); Qian Zhang, Beijing (CN); Jingguang Zhu, Beijing (CN)

(73) Assignees: Fuzhou BOE Optoelectronics Technology Co., Ltd., Fuzhou (CN); BOE Technology Group Co., Ltd., Beijing (CN)

( * ) Notice: Subject to any disclaimer, the term of this patent is extended or adjusted under 35 U.S.C. 154(b) by 75 days.

(21) Appl. No.: 18/692,793

(22) PCT Filed: Jul. 28, 2023

(86) PCT No.: PCT/CN2023/110033
§ 371 (c)(1),
(2) Date: Mar. 15, 2024

(87) PCT Pub. No.: WO2024/041311
PCT Pub. Date: Feb. 29, 2024

(65) Prior Publication Data
US 2025/0078751 A1      Mar. 6, 2025

(30) Foreign Application Priority Data

Aug. 24, 2022   (CN) ......................... 202211021460.3

(51) Int. Cl.
G09G 3/3233       (2016.01)
G09G 3/20         (2006.01)
H10K 59/35        (2023.01)

(52) U.S. Cl.
CPC ......... *G09G 3/3233* (2013.01); *G09G 3/2007* (2013.01); *G09G 2300/0439* (2013.01);
(Continued)

(58) Field of Classification Search
CPC .............. G09G 3/3233; G09G 3/2007; G09G 2300/0439; G09G 2300/0852;
(Continued)

(56) References Cited

U.S. PATENT DOCUMENTS

| 10,762,828 B1 * | 9/2020 | Ma ........................ G09G 3/2092 |
| 2011/0193856 A1 | 8/2011 | Han |
| 2014/0307010 A1 | 10/2014 | Han |
| 2019/0088709 A1 * | 3/2019 | Zeng ..................... H10H 29/142 |

(Continued)

FOREIGN PATENT DOCUMENTS

| CN | 103606351 A | 2/2014 |
| CN | 103927990 A | 7/2014 |

(Continued)

OTHER PUBLICATIONS

CN202211021460.3 first office action dated Aug. 21, 2024.

*Primary Examiner* — Kenneth B Lee, Jr.
(74) *Attorney, Agent, or Firm* — IPro, PLLC

(57)          ABSTRACT

Provided is a display panel. The display panel includes a base substrate, a plurality of first pixels, and a plurality of second pixels. The base substrate is provided with a special-shaped display region, and the special-shaped display region includes a special-shaped edge region and a main display region which are sequentially arranged along the direction distal from the special-shaped edge. The first pixels are disposed in the main display region. The second pixels are disposed in the special-shaped edge region. In the case that (Continued)

the display panel displays a picture of a target gray level, the potentials of the drive signals transmitted to the light-emitting elements by the pixel circuits in the second pixels with different distances from the special-shaped edge are different and are smaller than the potentials of the drive signals transmitted to the light-emitting elements by the pixel circuits in the first pixels.

16 Claims, 12 Drawing Sheets

(52) U.S. Cl.
CPC ............... *G09G 2300/0852* (2013.01); *G09G 2300/0861* (2013.01); *G09G 2310/08* (2013.01); *G09G 2320/0242* (2013.01); *G09G 2330/02* (2013.01); *H10K 59/353* (2023.02)

(58) Field of Classification Search
CPC ....... G09G 2300/0861; G09G 2310/08; G09G 2320/0242; G09G 2330/02; H10K 59/353
See application file for complete search history.

(56) References Cited

U.S. PATENT DOCUMENTS

| | | | | |
|---|---|---|---|---|
| 2019/0198581 | A1* | 6/2019 | Kim ...................... | H10K 59/351 |
| 2020/0006444 | A1* | 1/2020 | Li .......................... | H10K 59/352 |
| 2020/0074914 | A1* | 3/2020 | Wang ................... | G09G 3/2092 |
| 2021/0028247 | A1* | 1/2021 | Long ..................... | H10K 59/353 |
| 2021/0408193 | A1* | 12/2021 | Li .......................... | H10D 86/60 |

FOREIGN PATENT DOCUMENTS

| | | | |
|---|---|---|---|
| CN | 107123394 | A | 9/2017 |
| CN | 107422516 | A | 12/2017 |
| CN | 107665637 | A | 2/2018 |
| CN | 107742499 | A | 2/2018 |
| CN | 107767819 | A | 3/2018 |
| CN | 107784971 | A | 3/2018 |
| CN | 108550326 | A | 9/2018 |
| CN | 109087591 | A | 12/2018 |
| CN | 109859690 | A | 6/2019 |
| CN | 111627390 | A | 9/2020 |
| CN | 113658554 | A | 11/2021 |
| CN | 115346484 | A | 11/2022 |
| WO | 2019061712 | A1 | 4/2019 |

* cited by examiner

C1=C2     C1=0.547C2     C1=0.333C2    C1=0.215C2   C1=0.143C2

DISPLAY PANEL AND DISPLAY DEVICE

CROSS-REFERENCE TO RELATED APPLICATIONS

The present disclosure is a U.S. national phase application based on PCT/CN2023/110033, filed on Jul. 28, 2023, which claims priority to Chinese Patent Application No. 202211021460.3, filed on Aug. 24, 2022 and entitled "DISPLAY PANEL AND DISPLAY DEVICE", the disclosure of which is herein incorporated by reference in its entirety.

TECHNICAL FIELD

The present disclosure relates to the field of display technologies, and in particular, relates to a display panel and a display device.

BACKGROUND

With the continuous development of display technologies, various special-shaped display panels are widely used in display devices.

SUMMARY

A display panel and a display device are provided. The technical solutions are as follows:

In an aspect, a display panel is provided. The display panel includes:

a base substrate, provided with a special-shaped display region, wherein the special-shaped display region includes a special-shaped edge region and a main display region, the special-shaped edge region being proximal to a special-shaped edge of the special-shaped display region relative to the main display region;

a plurality of first pixels, disposed on one side of the base substrate and disposed in the main display region; and a plurality of second pixels, disposed on one side of the base substrate and disposed in the special-shaped edge region;

wherein a number of the plurality of second pixels is smaller than a number of the plurality of first pixels, and each of the plurality of first pixels and the plurality of second pixels includes: a pixel circuit and a light-emitting element, the pixel circuit being coupled to the light-emitting element and being configured to transmit a drive signal to the light-emitting element to drive the light-emitting element to emit light; and in a case that the display panel displays a picture of a target gray level, potentials of the drive signals transmitted to the light-emitting elements by the pixel circuits in the second pixels with different distances from the special-shaped edge among the plurality of second pixels are different, and the potential of the drive signal transmitted to the light-emitting element by the pixel circuit in each of the second pixels is smaller than a potential of the drive signal transmitted to the light-emitting element by the pixel circuit in any of the first pixels.

In some embodiments, the plurality of second pixels include: a plurality of pixel groups, wherein the plurality of pixel groups are sequentially arranged along a direction from the main display region to the special-shaped edge, and distances from the pixel groups to the special-shaped edge are different;

the second pixels in each of the pixel groups are arranged in a step shape along an extending direction parallel to the special-shaped edge, and distances from the second pixels in each of the pixel groups to the special-shaped edge are equal; and in the case that the display panel displays the picture of the target gray level, potentials of the drive signals transmitted to the light-emitting elements by the pixel circuits in the second pixels in each of pixel groups are equal, and the potentials of the drive signals transmitted to the light-emitting elements by the pixel circuits in the second pixels in each of the pixel groups gradually decrease along the direction from the main display region to the special-shaped edge, such that display gray levels of the second pixels gradually decrease.

In some embodiments, in any two adjacent pixel groups, the potentials of the drive signals transmitted to the light-emitting elements by the pixel circuits in the second pixels gradually decrease according to a target decreasing value, such that along the direction from the main display region to the special-shaped edge, in each two adjacent pixel groups, a ratio of display gray levels of the second pixels in one pixel group to display gray levels of the second pixels in the other pixel group is a target ratio.

In some embodiments, the target ratio is 1/2.

In some embodiments, the pixel circuit includes: a data writing circuit, a light-emitting control circuit, a potential adjustment circuit, and a drive circuit;

wherein the data writing circuit is coupled to a data signal terminal, a first scanning terminal, and a first node, respectively and is configured to control, in response to a first scanning signal provided by the first scanning terminal, on-off of the data signal terminal with the first node;

the light-emitting control circuit is coupled to a second scanning terminal, a light-emitting control terminal, a first power terminal, a second power terminal, the first node, a second node, and a third node, respectively and is configured to control, in response to a second scanning signal provided by the second scanning terminal, on-off of the second power terminal with the first node and on-off of the second node with the third node, and control, in response to a light-emitting control signal provided by the light-emitting control terminal, on-off of the first power terminal with the third node;

the potential adjustment circuit is coupled to the first node, the second node, and a fourth node, respectively and is configured to adjust potentials of the first node, the second node, and the fourth node;

the drive circuit is coupled to the second node, the third node, and the fourth node, respectively and is configured to transmit, based on the potentials of the second node and the third node, a drive signal to the fourth node; and the light-emitting element is coupled to the fourth node and the second power terminal respectively and is configured to emit light based on the potential of the fourth node and a second power signal provided by the second power terminal.

In some embodiments, the potential adjustment circuit includes: a first capacitor and a second capacitor;

wherein one end of the first capacitor is coupled to the first node, and the other end of the first capacitor is coupled to the second node; and one end of the second capacitor is coupled to the second node, and the other end of the second capacitor is coupled to the fourth node.

In some embodiments, in the second pixels, capacitances of second capacitors in the second pixels are equal, a capacitance of the first capacitor is a target multiple of the capacitance of the second capacitor, the target multiple being less than or equal to 1; and for each of the second pixels, the target multiple is associated with the distance from the second pixel to the special-shaped edge, such that the potentials of the drive signals transmitted to the light-emitting elements by the pixel circuits in the second pixels with different distances from the special-shaped edge among the plurality of second pixels are different.

In some embodiments, each of the first capacitor and the second capacitor includes: a first electrode plate, an insulating layer, and a second electrode plate sequentially stacked along a direction distal from the base substrate, and an orthographic projection of the first electrode plate on the base substrate is overlapped with an orthographic projection of the second electrode plate on the base substrate; and in each of the second pixels, dielectric constants of the insulating layers in the first capacitor and the second capacitor are the same, distances between the first electrode plates and the second electrode plates in the first capacitor and the second capacitor are equal, and an overlapping area between the first electrode plate and the second electrode plate in the first capacitor is the target multiple of an overlapping area between the first electrode plate and the second electrode plate in the second capacitor.

In some embodiments, an area of the first electrode plate in the first capacitor is the target multiple of an area of the first electrode plate in the second capacitor, and an area of the second electrode plate in the first capacitor is the target multiple of an area of the second electrode plate in the second capacitor.

In some embodiments, for the first electrode plate and the second electrode plate in the first capacitor, an area of one electrode plate is the same as an area of one electrode plate of the first electrode plate and the second electrode plate in the second capacitor, and an area of the other electrode plate is the target multiple of an area of the other electrode plate of the first electrode plate and the second electrode plate in the second capacitor.

In some embodiments, in the first capacitor and the second capacitor, the one electrode plate is the first electrode plate, and the other electrode plate is the second electrode plate.

In some embodiments, the light-emitting control circuit is further coupled to a third scanning terminal and the fourth node and is configured to control, in response to a third scanning signal provided by the third scanning terminal, on-off of the second power terminal with the fourth node; the light-emitting control circuit includes: a first reset sub-circuit, a second reset sub-circuit, a compensation sub-circuit, and a light-emitting control sub-circuit;

wherein the first reset sub-circuit is coupled to the second scanning terminal, the second power terminal, and the first node, respectively and is configured to control, in response to the second scanning signal, on-off of the second power terminal with the first node;

the second reset sub-circuit is coupled to the third scanning terminal, the second power terminal, and the fourth node, respectively and is configured to control, in response to the third scanning signal, on-off of the second power terminal with the fourth node;

the compensation sub-circuit is coupled to the second scanning terminal, the second node, and the third node, respectively and is configured to control, in response to the second scanning signal, on-off of the second node with the third node; and the light-emitting control sub-circuit is coupled to the light-emitting control terminal, the first power terminal, and the third node, respectively and is configured to control, in response to the light-emitting control signal, on-off of the first power terminal with the third node.

In some embodiments, the data writing circuit includes: a first transistor; the first reset sub-circuit includes: a second transistor; the second reset sub-circuit includes: a third transistor; the compensation sub-circuit includes: a fourth transistor; the light-emitting control sub-circuit includes: a fifth transistor; the drive circuit includes: a sixth transistor;

wherein a gate of the first transistor is coupled to the first scanning terminal, a first electrode of the first transistor is coupled to the data signal terminal, and a second electrode of the first transistor is coupled to the first node;

a gate of the second transistor is coupled to the second scanning terminal, a first electrode of the second transistor is coupled to the second power terminal, and a second electrode of the second transistor is coupled to the first node;

a gate of the third transistor is coupled to the third scanning terminal, a first electrode of the third transistor is coupled to the second power terminal, and a second electrode of the third transistor is coupled to the fourth node;

a gate of the fourth transistor is coupled to the second scanning terminal, a first electrode of the fourth transistor is coupled to the third node, and a second electrode of the fourth transistor is coupled to the second node;

a gate of the fifth transistor is coupled to the light-emitting control terminal, a first electrode of the fifth transistor is coupled to the first power terminal, and a second electrode of the fifth transistor is coupled to the third node; and a gate of the sixth transistor is coupled to the second node, a first electrode of the sixth transistor is coupled to the third node, and a second electrode of the sixth transistor is coupled to the fourth node.

In some embodiments, the base substrate is further provided with a non-display region adjacent to the special-shaped display region; and the display panel further includes:

a black matrix layer, disposed on one side of the plurality of first pixels and the second pixels distal from the base substrate and disposed in the special-shaped display region and the non-display region.

In another aspect, a display device is provided. The display device includes: a power supply assembly, and the display panel according to the above aspect;

wherein the power supply assembly is coupled to the display panel and is configured to supply power to the display panel.

BRIEF DESCRIPTION OF THE DRAWINGS

For clearer descriptions of the technical solutions according to the embodiments of the present invention, the drawings required to be used in the description of the embodiments are briefly introduced below. It is apparent that the drawings in the description below are only some embodiments of the present invention, and for those of ordinary skill in the art, other drawings may be obtained from the drawings without creative efforts.

DETAILED DESCRIPTION

For clearer descriptions of the objectives, technical solutions, and advantages of the present disclosure, embodiments of the present disclosure are further described in detail below with reference to the drawings.

The special-shaped display panel refers to a display panel with a special-shaped display region, and the special-shaped display region is generally in a non-rectangular shape such as a circle or a sector, that is, the edge of the special-shaped display region is generally in a curve (e.g., a rounded corner) shape.

However, the special-shaped display panel has poor uniformity of pixel arrangement at the edge due to the curved edge. And then, rainbow stripes are easy to appear on the special-shaped display panel during display, resulting in a poor display effect.

Figure 1:
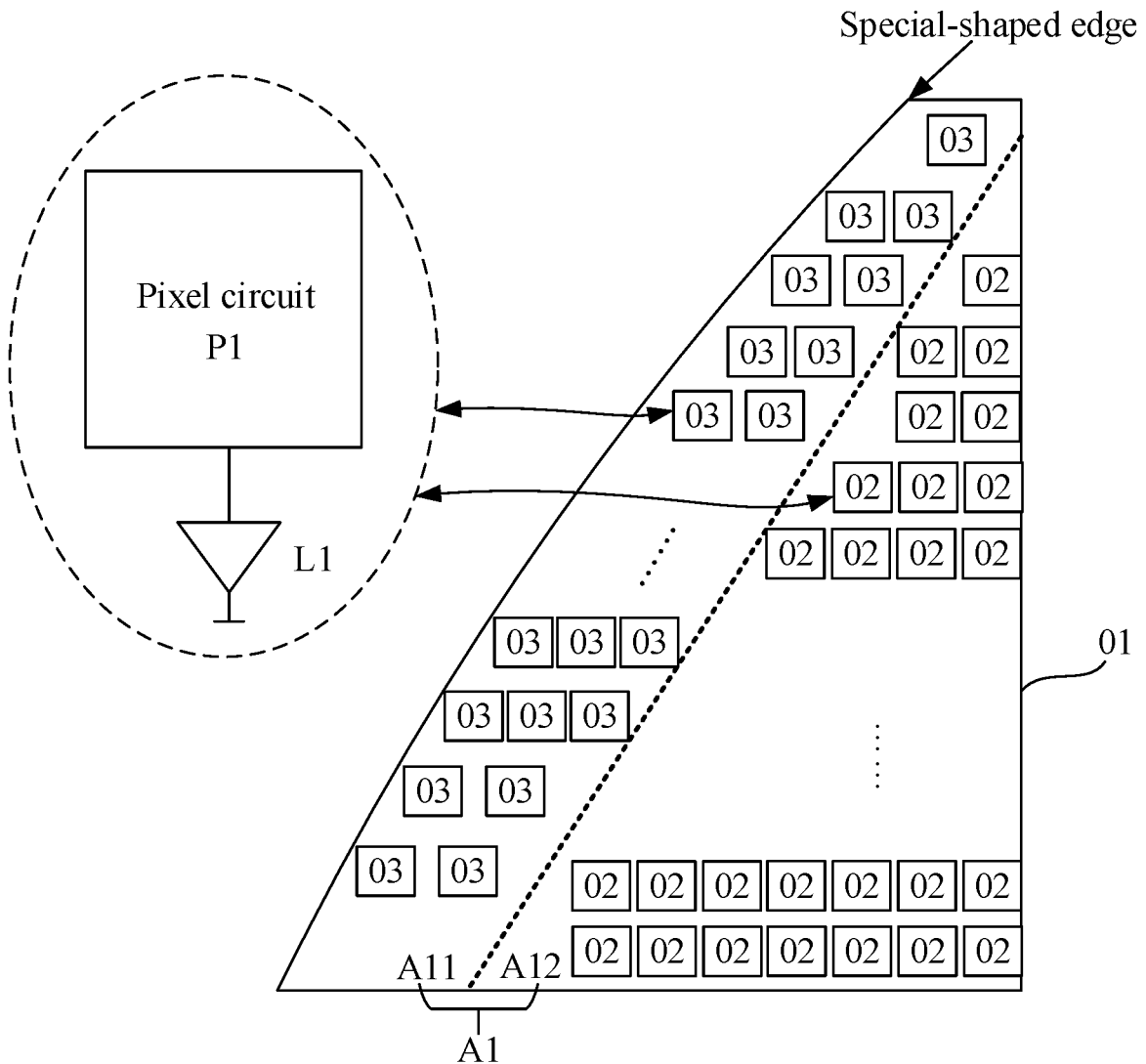
FIG. 1 is a schematic structural diagram of a display panel according to some embodiments of the present disclosure.

FIG. 1 is a schematic structural diagram of a display panel according to some embodiments of the present disclosure. As shown in FIG. 1, the display panel includes: a base substrate 01, a plurality of first pixels 02, and a plurality of second pixels 03.

The base substrate 01 is provided with a special-shaped display region A1. The special-shaped display region A1 can be partitioned into a special-shaped edge region A11 and a main display region A12, the special-shaped edge region A11 being proximal to a special-shaped edge of the special-shaped display region A1 relative to the main display region A12. That is, referring to FIG. 1, the special-shaped edge region A11 and the main display region A12 are sequentially arranged along a direction distal from the special-shaped edge.

In some embodiments, the special-shaped display region A1 is generally in a non-rectangular shape such as a sector, an arc, a circle, a cylinder, or a polygon. Accordingly, the special-shaped edge is generally in a curve shape. For example, the special-shaped display region A1 of the base substrate 01 shown in FIG. 1 is in a circular arc shape, and the special-shaped edge is in an arc shape.

The plurality of first pixels 02 are disposed on one side of the base substrate 01 and disposed in the main display region A12. The plurality of second pixels 03 are disposed on one side of the base substrate 01 and disposed in the special-shaped edge region A11.

In some embodiments, in the embodiments of the present disclosure, the area of the special-shaped edge region A11 is smaller than the area of the main display region A12. Accordingly, the number of the plurality of second pixels 03 is smaller than the number of the plurality of first pixels 02.

As can be seen from the enlarged schematic diagram of the first pixels 02 and the second pixels 03 in FIG. 1, each of the plurality of first pixels 02 and the plurality of second pixels 03 in the embodiments of the present disclosure includes: a pixel circuit P1 and a light-emitting element L1.

The pixel circuit P1 is coupled to the light-emitting element L1 and is configured to transmit a drive signal to the light-emitting element L1 to drive the light-emitting element L1 to emit light. Thus, the luminance brightness of the light-emitting element L1 is controlled by the potential of the drive signal and is positively correlated with the potential of the drive signal. That is, the larger the potential of the drive signal is, the brighter the luminance brightness of the light-emitting element L1 is; and conversely, the smaller the potential of the drive signal is, the darker the luminance brightness of the light-emitting element L1 is. For example, the light-emitting element L1 is an organic light-emitting diode (OLED) driven by currents to emit light, and accordingly, the drive signal transmitted to the light-emitting element L1 by the pixel circuit P1 is a drive current, and the magnitude of the potential of the drive signal is the magnitude of the drive current. The luminance brightness of the light-emitting element L1 is controlled by the magnitude of the drive current, and is positively correlated with the magnitude of the drive current. The display panel may be an OLED display panel. The OLED display panel has the advantages of self-luminescence, low drive voltage, high luminous efficiency, short response time, flexible display, and the like.

In addition, the light-emitting element L1 is also not limited to the OLED. For example, in some other embodiments, the light-emitting element L1 is a micro LED or a mini LED.

In some embodiments, each of the plurality of first pixels 02 and the plurality of second pixels 03 includes a plurality of pixels of different colors. For example, a plurality of red (R) pixels, a plurality of green (G) pixels, and a plurality of blue (B) pixels are generally included. As the second pixels 03 are disposed in the special-shaped edge region A11, the plurality of second pixels 03 have poor uniformity of arrangement and are arranged aperiodically due to the influence of the special-shaped edge, and thus the ratios of the three colors RGB are different. Currently, in the case that the display panel displays a picture of a target gray level (e.g., L255), the potentials of the drive signals transmitted to the light-emitting elements L1 by the pixel circuits P1 in the pixels (including the first pixels 02 and the second pixels 03) of the same color are equal, that is, the luminance brightness of the pixels of the same color is the same. Therefore, based on the unequal ratios of the three colors RGB in the special-shaped edge region A11, a color cast is easily caused, and then rainbow stripes appear on the display panel, resulting in a poor display effect.

In the embodiments of the present disclosure, in the case that the display panel displays the picture of the target gray level, potentials of the drive signals transmitted to the light-emitting elements L1 by the pixel circuits P1 in the second pixels 03 with different distances from the special-shaped edge among the plurality of second pixels 03 are set to be different, and the potential of the drive signal transmitted to the light-emitting element L1 by the pixel circuit P1 in each of the second pixels 03 is set to be smaller than a potential of the drive signal transmitted to the light-emitting element L1 by the pixel circuit P1 in any of the first pixels 02. That is, in the case that all the first pixels 02 and all the second pixels 03 are used to display the picture of the target gray level in the display panel, the potential of the drive signal transmitted to the light-emitting element L1 by the pixel circuit P1 in each of the second pixels 03 is set to be associated with the distance from the special-shaped edge and is set to be smaller than the potential of the drive signal transmitted to the light-emitting element L1 by the pixel circuit P1 in any of the first pixels 02. In addition, the potential of the drive signal is the magnitude of the drive current. Therefore, the luminance brightness of the second pixels 03 at different distance positions from the special-shaped edge is different, the luminance brightness of the second pixels 03 gradually changes along the direction from the main display region A12 to the special-shaped edge, and the maximum luminance brightness of the plurality of second pixels 03 is smaller than that of the first pixels 02, and thus the problem of rainbow stripes caused by uneven pixel arrangement can be reliably avoided, thereby ensuring a good display effect.

For example, in the case that all the first pixels 02 and all the second pixels 03 are used to display the picture of the target gray level in the display panel, the potential of the drive signal transmitted to the light-emitting element L1 by the pixel circuit P1 in each of the second pixels 03 may be set to be positively correlated with the distance from the special-shaped edge. That is, the potentials of the drive signals transmitted to the light-emitting elements L1 by the pixel circuits P1 in the second pixels 03 closer to the special-shaped edge (i.e., farther from the main display region A12) among the plurality of second pixels 03 are set to be smaller, such that the luminance brightness of the light-emitting elements L1 in the second pixels 03 closer to the special-shaped edge is darker, and moreover, the potentials of the drive signals transmitted to the light-emitting elements L1 by the pixel circuits P1 in the second pixels 03 farther from the special-shaped edge (i.e., closer to the main display region A12) are set to be larger, such that the luminance brightness of the light-emitting elements L1 in the second pixels 03 farther from the special-shaped edge is brighter. Finally, the luminance brightness of the second pixels 03 at different distance positions from the special-shaped edge gradually decreases along the direction from the main display region A12 to the special-shaped edge.

It should be noted that the same luminance brightness of the second pixels 03 described in the embodiments of the present disclosure is configured to indicate that the luminance brightness of the second pixels 03 of the same color is the same, and in the case that the potential of the drive signal is designed based on the distance, the description will be made for the second pixels 03 of the same color. The luminance ratios of the second pixels 03 of different colors in the picture of the target gray level may be different, and accordingly, for the second pixels 03 of different colors, the potential design of the drive signal may be different, and the design principle is as follows: the potential of the drive signal transmitted to the light-emitting element L1 by the pixel circuit P1 in the second pixel 03 is positively correlated with the distance from the special-shaped edge.

In summary, the embodiments of the present disclosure provide a display panel. The display panel includes a base substrate, a plurality of first pixels, and a plurality of second pixels. The base substrate is provided with a special-shaped display region, and the special-shaped display region is partitioned into a special-shaped edge region and a main display region which are sequentially arranged along the direction distal from the special-shaped edge. The first pixels are disposed in the main display region. The second pixels are disposed in the special-shaped edge region. In the case that the display panel displays a picture of a target gray level, the potentials of the drive signals transmitted to the light-emitting elements by the pixel circuits in the second pixels with different distances from the special-shaped edge are different and are smaller than the potentials of the drive signals transmitted to the light-emitting elements by the pixel circuits in the first pixels, the luminance brightness of the second pixels at different distance positions from the special-shaped edge gradually changes, and the maximum luminance brightness of the second pixels is smaller than the luminance brightness of the first pixels. And then, the problem of rainbow stripes caused by uneven pixel arrangement can be avoided, thereby ensuring a good display effect.

Figure 2:
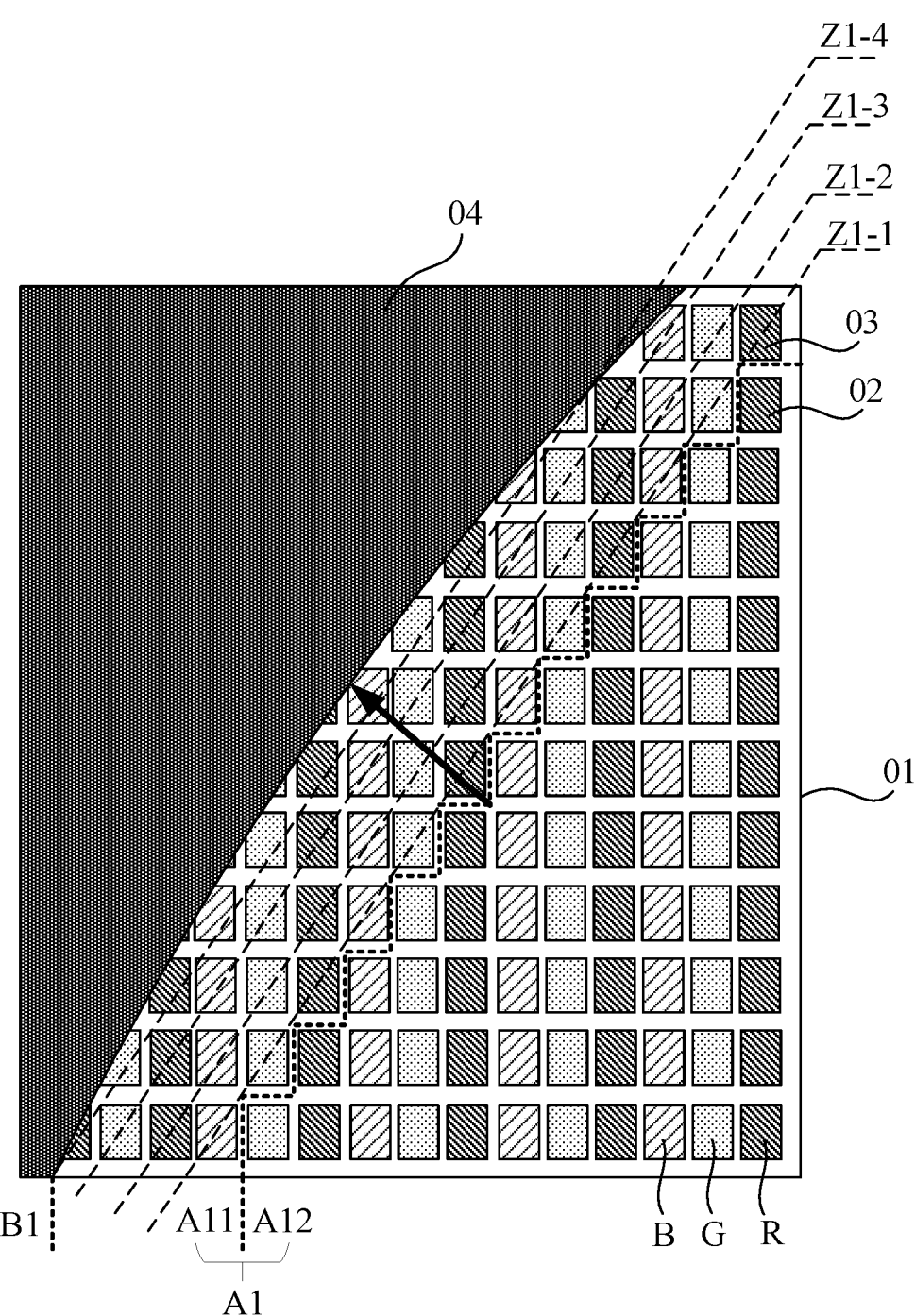
FIG. 2 is a schematic structural diagram of another display panel according to some embodiments of the present disclosure.

In some embodiments, FIG. 2 is a schematic structural diagram of another display panel according to some embodiments of the present disclosure. As shown in FIG. 2, the base substrate 01 is further provided with a non-display region B1 adjacent to the special-shaped display region A1. The display panel further includes: a black matrix (BM) layer 04, which is also referred to as the BM layer.

The black matrix layer 04 is disposed on one side of the plurality of first pixels 02 and the plurality of second pixels 03 distal from the base substrate 01 and is disposed in the special-shaped display region A1 and the non-display region B1. An orthographic projection of the black matrix layer 04 on the base substrate 01 is not overlapped with an orthographic projection of the plurality of first pixels 02 and the plurality of second pixels 03 on the base substrate 01. That is, the black matrix layer 04 may be provided with openings exposing the first pixels 02 and the second pixels 03, such that light emitted from the plurality of first pixels 02 and the plurality of second pixels 03 may be reliably emitted.

For example, FIG. 2 schematically shows only a portion of the black matrix layer 04 disposed in the non-display region B1. The boundary of the portion of the black matrix layer 04 proximal to the special-shaped display region A1 coincides with the special-shaped edge of the special-shaped display region A1.

Currently, in some embodiments, the problem of rainbow stripes caused by uneven pixel arrangement is solved by changing the aperture ratio of the black matrix layer 04, but the problem of poor peripheral BM aliasing may be caused while changing the aperture ratio. However, in the embodiments of the present disclosure, the aperture ratio is not changed, and only by designing the potentials transmitted to the light-emitting elements L1 by the pixel circuits P1, the problem of rainbow stripes is solved and the problem of poor peripheral BM aliasing caused by the change of the aperture ratio is reliably avoided, thereby ensuring a good display effect of the display panel.

In some embodiments, referring to FIG. 2, in the embodiments of the present disclosure, the plurality of second pixels 03 include: a plurality of pixel groups Z1. Four pixel groups are shown in FIG. 2 and are identified as Z1-1, Z1-2, Z1-3, and Z1-4, respectively. The plurality of pixel groups Z1 are sequentially arranged along the direction from the main display region A12 to the special-shaped edge, and the distances from the pixel groups Z1 to the special-shaped edge are different. The second pixels 03 in each of the pixel groups Z1 are arranged in a step shape along an extending direction parallel to the special-shaped edge, and the distances from the second pixels 03 in each of the pixel groups Z1 to the special-shaped edge are equal.

That is, the plurality of second pixels 03 may be partitioned into the plurality of pixel groups Z1 based on the distances from the special-shaped edge along the direction pointing from the main display region A12 to the special-shaped edge (i.e., a direction indicated by the arrow in FIG. 2) within the special-shaped edge region A11. Moreover, the second pixels 03 in each of the pixel groups Z1 may be arranged in a step shape due to the influence of the arc-shaped special-shaped edge. FIG. 2 further schematically shows the pixels of three colors R, G and B, where the same fill pattern represents the same color, and different fill patterns represent different colors.

Based on the partition according to the above embodiments, in the case that the display panel displays a picture of a target gray level, the potentials of the drive signals transmitted to the light-emitting elements L1 by the pixel circuits P1 in the second pixels 03 in each of the pixel groups Z1 may be equal, such that the luminance brightness of the second pixels 03 in each of the pixel groups Z1 may be the same. In addition, along the direction from the main display region A12 to the special-shaped edge, the potentials of the drive signals transmitted to the light-emitting elements L1 by the pixel circuits P1 in the second pixels 03 in each of the pixel groups Z1 may gradually decrease, such that the luminance brightness of the second pixels 03 in each of the pixel groups Z1 gradually decreases, that is, the luminance gradually changes, along the direction from the main display region A12 to the special-shaped edge. The luminance brightness may be characterized by display gray levels. Therefore, the display gray levels of the second pixels 03 in each of the pixel groups Z1 may be the same, and the gray levels of the second pixels 03 in the pixel groups Z1 gradually decrease along the direction from the main display region A12 to the special-shaped edge.

In some embodiments, in the embodiments of the present disclosure, in any two adjacent pixel groups Z1, the potentials of the drive signals transmitted to the light-emitting elements L1 by the pixel circuits P1 in the second pixels 03 gradually decrease according to a target decreasing value, such that along the direction from the main display region A12 to the special-shaped edge, in each two adjacent pixel groups Z1, a ratio of display gray levels of the second pixels 03 in one pixel group Z1 to display gray levels of the second pixels 03 in the other pixel group Z1 is a target ratio. That is, along the direction from the main display region A12 to the special-shaped edge, the potentials of the drive signals transmitted to the light-emitting elements L1 by the pixel circuits P1 in the second pixels 03 in each two adjacent pixel groups Z1 gradually decrease according to the same target decreasing value. Accordingly, the display gray levels of the second pixels 03 in each two adjacent pixel groups Z1 also gradually decrease according to the same gray level value, that is, the decreasing amplitude is the same. Therefore, the good display uniformity of the display panel is ensured, which further improves the display effect.

In some embodiments, the target ratio is 1/2. That is, along the direction from the main display region A12 to the special-shaped edge, the display gray levels (also referred to as the luminance brightness) of the second pixels 03 in each of the pixel groups Z1 are gradually halved. Therefore, the problem of rainbow stripes is better avoided, thereby ensuring a good display effect.

Figure 3:
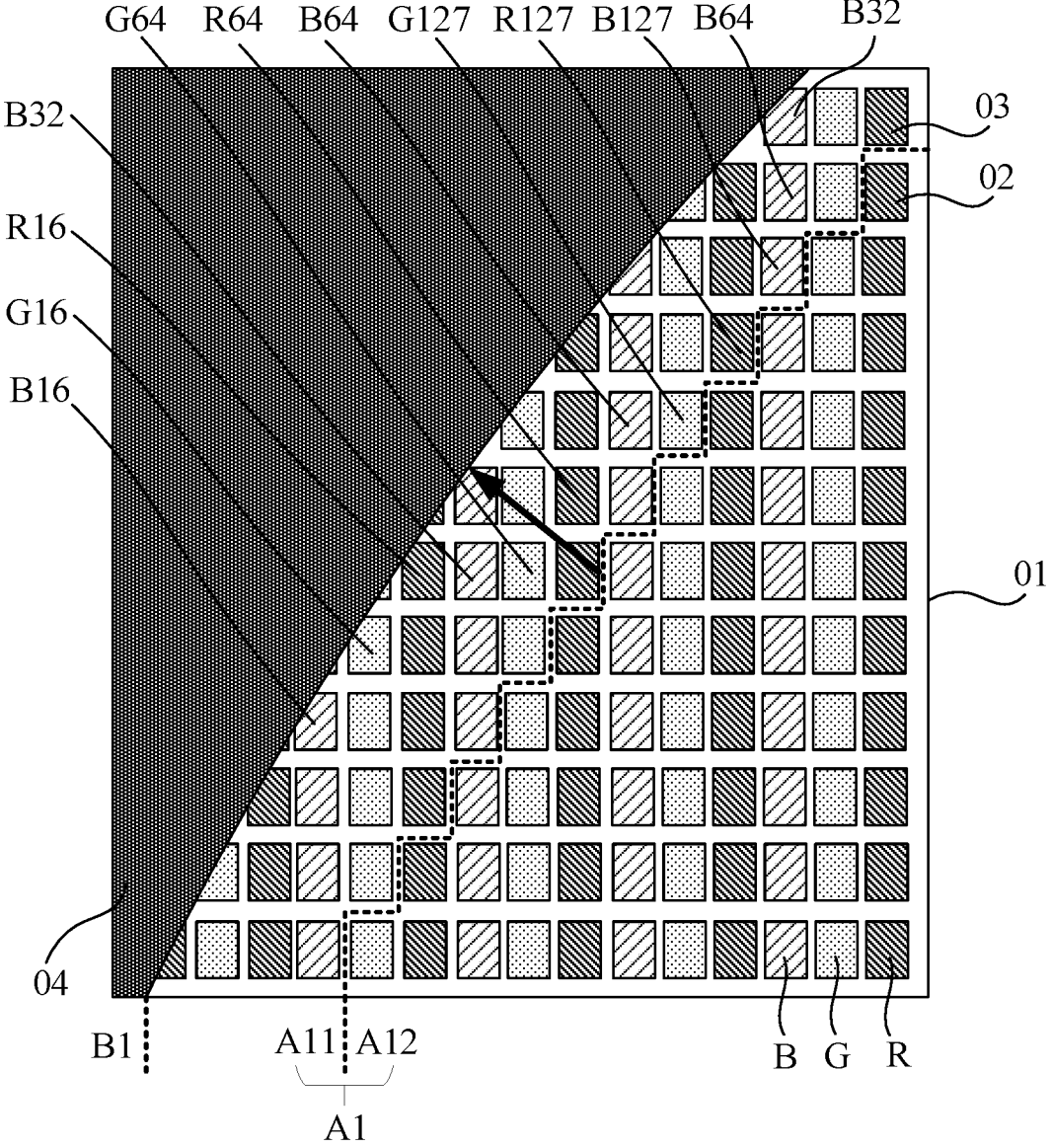
FIG. 3 is a schematic structural diagram of still another display panel according to some embodiments of the present disclosure.

For example, taking the target gray level as L255 and the target ratio as 1/2 as an example, in combination with FIGS. 2 and 3, in the special-shaped edge region A11, along the direction from the main display region A12 to the special-shaped edge, the display gray levels of second pixels 03 in a first pixel group Z1-1 are 127, and in FIG. 3, the display gray levels of a red R pixel, a green G pixel, and a blue B pixel in the first pixel group Z1-1 are identified as R127, G127, and B127, respectively. In a second pixel group Z1-2 adjacent to the first pixel group Z1-1, the display gray levels of second pixels 03 may be reduced to 64, which is 1/2 of the display gray levels of the second pixels 03 in the first pixel group Z1-1, and in FIG. 3, the display gray levels of a red R pixel, a green G pixel, and a blue B pixel in the second pixel group Z1-2 are identified as R64, G64, and B64, respectively. In a third pixel group Z1-3 adjacent to the second pixel group Z1-2, the display gray levels of second pixels 03 may be reduced to 32, which is 1/2 of the display gray levels of the second pixels 03 in the second pixel group Z1-2, and in FIG. 3, the display gray level of a blue B pixel in the third pixel group Z1-3 is identified as B32. In a fourth pixel group Z1-4 adjacent to the third pixel group Z1-3, the display gray levels of second pixels 03 may be reduced to 16, which is 1/2 of the display gray levels of the second pixels 03 in the third pixel group Z1-3, and in FIG. 3, the display gray levels of a red R pixel, a green G pixel, and a blue B pixel in the fourth pixel group Z1-4 are identified as R16, G16, and B16, respectively.

In addition, in some other embodiments, the decreasing magnitude may also be different. That is, taking three adjacent pixel groups Z1 as an example, the decreasing magnitude of the intermediate pixel group Z1 is different from the decreasing magnitude of one adjacent pixel group Z1 and the decreasing magnitude of the other adjacent pixel group Z1. Moreover, in the case that the decreasing magnitudes are the same, the target ratio may also be other values, such as 1/3.

Figure 4:
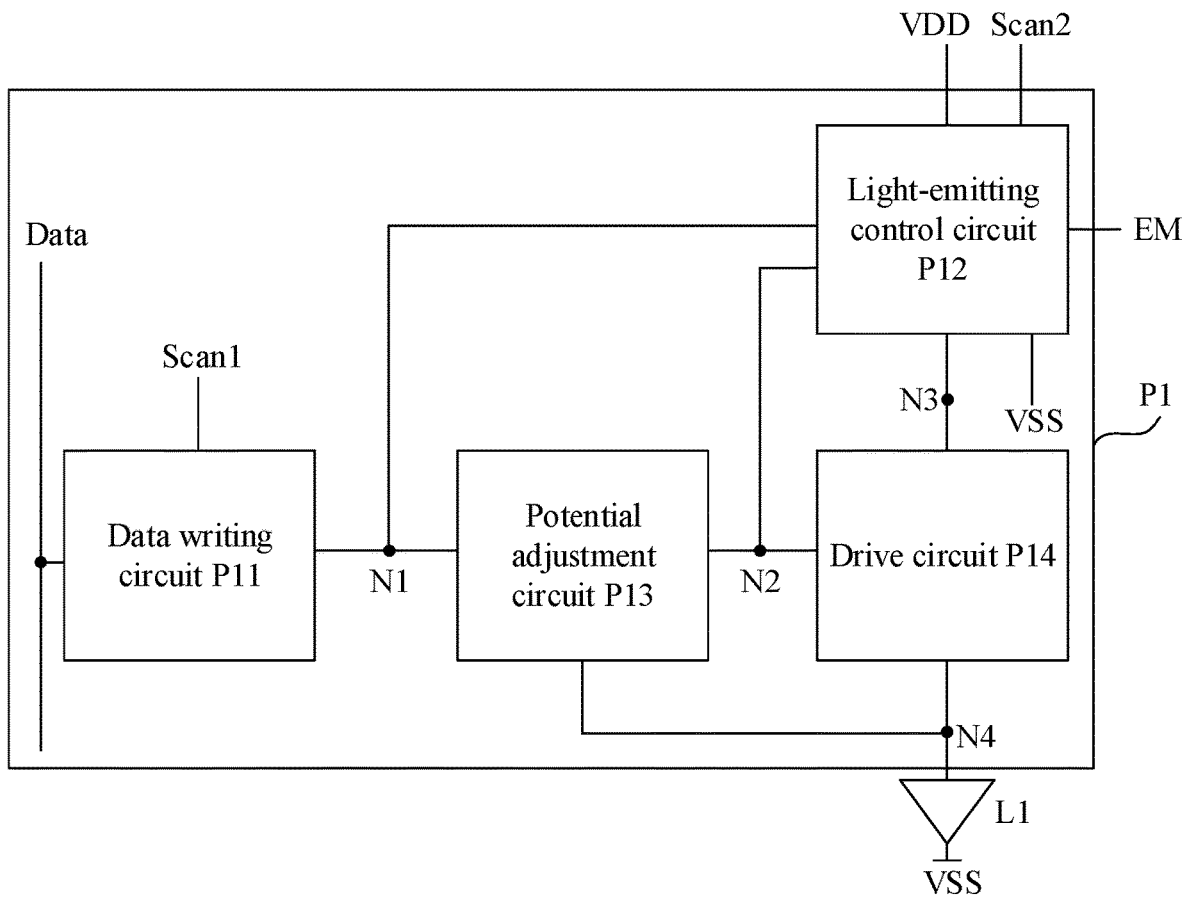
FIG. 4 is a schematic structural diagram of a pixel circuit according to some embodiments of the present disclosure.

FIG. 4 is a schematic structural diagram of a pixel circuit according to some embodiments of the present disclosure. As shown in FIG. 4, the pixel circuit P1 includes: a data writing circuit P11, a light-emitting control circuit P12, a potential adjustment circuit P13, and a drive circuit P14.

The data writing circuit P11 is coupled to a data signal terminal Data, a first scanning terminal Scan1, and a first node N1, respectively and is configured to control, in response to a first scanning signal provided by the first scanning terminal Scan1, on-off of the data signal terminal Data with the first node N1.

For example, the data writing circuit P11 may control the data signal terminal Data to conduct with the first node N1 in the case that the potential of the first scanning signal provided by the first scanning terminal Scan1 is a first potential. At this time, the data signal provided by the data signal terminal Data may be transmitted to the first node N1 to charge the first node N1. Moreover, the data writing circuit P11 may control the data signal terminal Data to be uncoupled from the first node N1 in the case that the potential of the first scanning signal provided by the first scanning terminal Scan1 is a second potential.

In some embodiments, the first potential is an active potential, and the second potential is an inactive potential. In addition, in the embodiments of the present disclosure, the first potential is a high potential relative to the second potential.

The light-emitting control circuit P12 is coupled to a second scanning terminal Scan2, a light-emitting control terminal EM, a first power terminal VDD, a second power terminal VSS, the first node N1, a second node N2, and a third node N3, respectively and is configured to control, in response to a second scanning signal provided by the second scanning terminal Scan2, on-off of the second power terminal VSS with the first node N1 and on-off of the second node N2 with the third node N3, and control, in response to a light-emitting control signal provided by the light-emitting control terminal EM, on-off of the first power terminal VDD with the third node N3.

For example, the light-emitting control circuit P12 may control the second power terminal VSS to conduct with the first node N1 and the second node N2 to conduct with the third node N3 in the case that the potential of the second scanning signal provided by the second scanning terminal Scan2 is the first potential. At this time, the second power signal provided by the second power terminal VSS may be transmitted to the first node N1 to reset the first node N1, and the potential of the second node N2 and the potential of the third node N3 may affect each other. Moreover, the light-emitting control circuit P12 may control the second power terminal VSS to be uncoupled from the first node N1 and the second node N2 to be uncoupled from the third node N3 in the case that the potential of the second scanning signal provided by the second scanning terminal Scan2 is the second potential.

Similarly, the light-emitting control circuit P12 may control the first power terminal VDD to conduct with the third node N3 in the case that the potential of the light-emitting control signal provided by the light-emitting control terminal EM is the first potential. At this time, the first power signal provided by the first power terminal VDD may be transmitted to the third node N3 to charge the third node N3. In addition, the light-emitting control circuit P12 may control the first power terminal VDD to be uncoupled from the third node N3 in the case that the potential of the light-emitting control signal provided by the light-emitting control terminal EM is the second potential.

In some embodiments, in the embodiments of the present disclosure, the first power signal may be a high potential relative to the second power signal. The second power terminal VSS may be a ground terminal.

The potential adjustment circuit P13 is coupled to the first node N1, the second node N2, and the fourth node N4, respectively and is configured to adjust potentials of the first node N1, the second node N2, and the fourth node N4.

The drive circuit P14 is coupled to the second node N2, the third node N3, and the fourth node N4, respectively and is configured to transmit, based on the potentials of the second node N2 and the third node N3, a drive signal (e.g., a drive current described in the above embodiments) to the fourth node N4.

The light-emitting element L1 is coupled to the fourth node N4 and the second power terminal VSS respectively and is configured to emit light based on the potential of the fourth node N4 and a second power signal provided by the second power terminal VSS.

For example, the light-emitting element L1 may emit light under the potential difference between the fourth node N4 and the second power signal.

In some embodiments, referring to FIG. 4, in the case that the light-emitting element L1 is an OLED, an anode of the light-emitting element L1 is coupled to the fourth node N4, and a cathode of the light-emitting element L1 is coupled to the second power terminal VSS. In addition, in some other embodiments, the anode and the cathode of the light-emitting element L1 may be interchanged.

Figure 5:
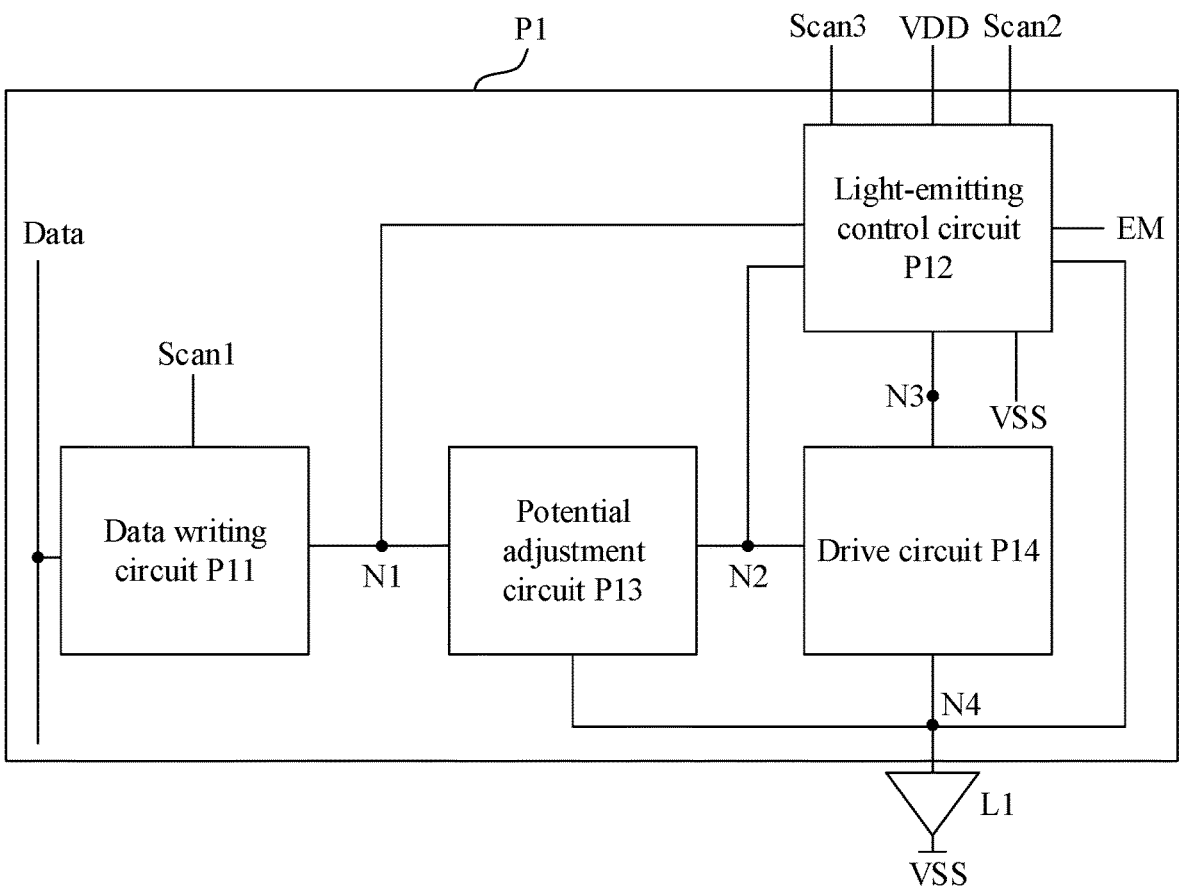
FIG. 5 is a schematic structural diagram of another pixel circuit according to some embodiments of the present disclosure.

Based on FIG. 4, FIG. 5 shows a schematic structural diagram of another pixel circuit. As shown in FIG. 5, the light-emitting control circuit P12 is further coupled to a third scanning terminal Scan3 and the fourth node N4 and is configured to control, in response to a third scanning signal provided by the third scanning terminal Scan3, on-off of the second power terminal VSS with the fourth node N4.

For example, the light-emitting control circuit P12 may further control the second power terminal VSS to conduct with the fourth node N4 in the case that the potential of the third scanning signal provided by the third scanning terminal Scan3 is the first potential. At this time, the second power signal provided by the second power terminal VSS may be transmitted to the fourth node N4 to reset the fourth node N4. As the fourth node N4 is coupled to the anode of the light-emitting element L1, it can be considered as resetting the anode of the light-emitting element L1. Moreover, the light-emitting control circuit P12 may further control the second power terminal VSS to be uncoupled from the fourth node N4 in the case that the potential of the third scanning signal provided by the third scanning terminal Scan3 is the second potential. That is, the light-emitting control circuit P12 may reset the anode of the light-emitting element L1 in addition to the first node N1 as shown in FIG. 4.

Figure 6:
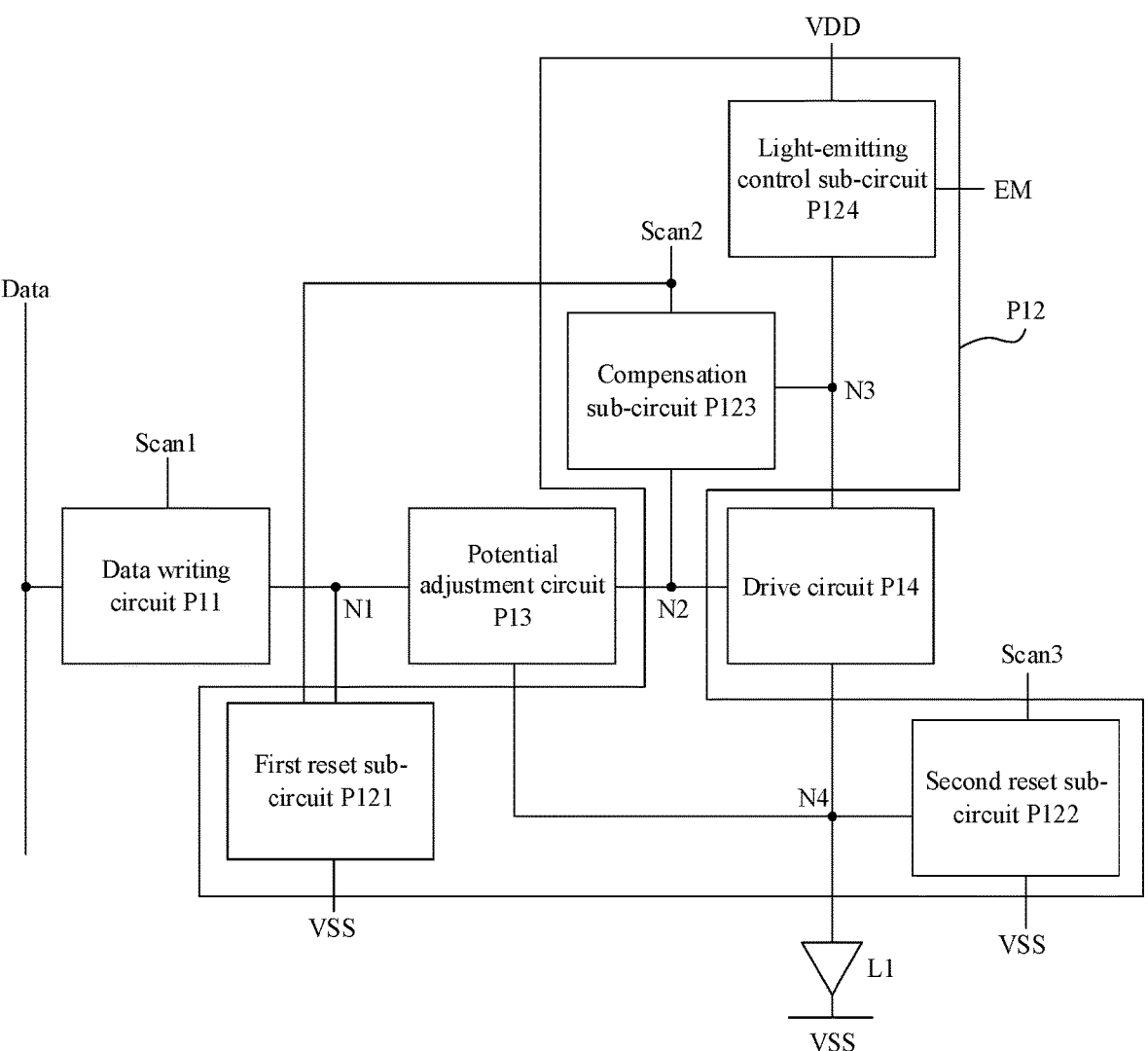
FIG. 6 is a schematic structural diagram of still another pixel circuit according to some embodiments of the present disclosure.

Based on FIG. 5, FIG. 6 shows a schematic structural diagram of yet another pixel circuit. As shown in FIG. 6, the light-emitting control circuit P12 includes: a first reset sub-circuit P121, a second reset sub-circuit P122, a compensation sub-circuit P123, and a light-emitting control sub-circuit P124.

The first reset sub-circuit P121 is coupled to the second scanning terminal Scan2, the second power terminal VSS, and the first node N1, respectively and is configured to control, in response to the second scanning signal, on-off of the second power terminal VSS with the first node N1.

For example, the first reset sub-circuit P121 may control the second power terminal VSS to conduct with the first node N1 in the case that the potential of the second scanning signal is the first potential, and may control the second power terminal VSS to be uncoupled from the first node N1 in the case that the potential of the second scanning signal is the second potential.

The second reset sub-circuit P122 is coupled to the third scanning terminal Scan3, the second power terminal VSS, and the fourth node N4, respectively and is configured to control, in response to the third scanning signal, on-off of the second power terminal VSS with the fourth node N4.

For example, the second reset sub-circuit P122 may control the second power terminal VSS to conduct with the fourth node N4 in the case that the potential of the third scanning signal is the first potential, and may control the second power terminal VSS to be uncoupled from the fourth node N4 in the case that the potential of the third scanning signal is the second potential.

The compensation sub-circuit P123 is coupled to the second scanning terminal Scan2, the second node N2, and the third node N3, respectively and is configured to control, in response to the second scanning signal, on-off of the second node N2 with the third node N3.

For example, the compensation sub-circuit P123 may control the second node N2 to conduct with the third node N3 in the case that the potential of the second scanning signal is the first potential, and may control the second node N2 to be uncoupled from the third node N3 in the case that the potential of the second scanning signal is the second potential.

The light-emitting control sub-circuit P124 is coupled to the light-emitting control terminal EM, the first power terminal VDD, and the third node N3 respectively and is configured to control, in response to the light-emitting control signal, on-off of the first power terminal VDD with the third node N3.

For example, the light-emitting control sub-circuit P124 may control the first power terminal VDD to conduct with the third node N3 in the case that the potential of the light-emitting control signal is the first potential, and may control the first power terminal VDD to be uncoupled from the third node N3 in the case that the potential of the light-emitting control signal is the second potential.

Figure 7:
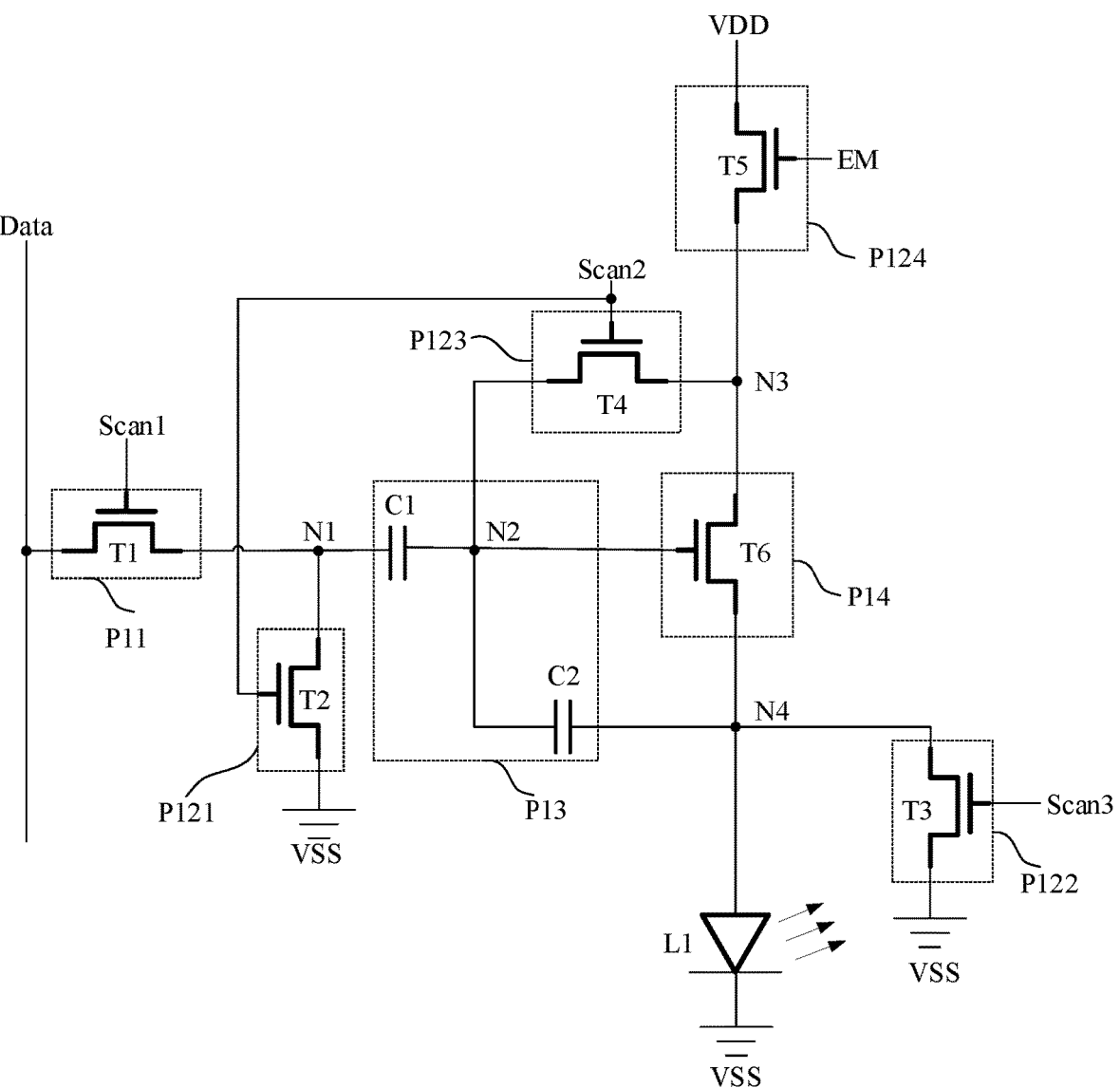
FIG. 7 is a schematic structural diagram of yet still another pixel circuit according to some embodiments of the present disclosure.

Based on FIG. 6, FIG. 7 shows a schematic structural diagram of yet another pixel circuit. As shown in FIG. 7, the data writing circuit P11 includes: a first transistor T1. The first reset sub-circuit P121 includes: a second transistor T2. The second reset sub-circuit P122 includes: a third transistor T3. The compensation sub-circuit P123 includes: a fourth transistor T4. The light-emitting control sub-circuit P124 includes: a fifth transistor T5. The drive circuit P14 includes: a sixth transistor T6. The potential adjustment circuit P13 includes: a first capacitor C1 and a second capacitor C2.

A gate of the first transistor T1 is coupled to the first scanning terminal Scan1, a first electrode of the first transistor T1 is coupled to the data signal terminal Data, and a second electrode of the first transistor T1 is coupled to the first node N1.

A gate of the second transistor T2 is coupled to the second scanning terminal Scan2, a first electrode of the second transistor T2 is coupled to the second power terminal VSS, and a second electrode of the second transistor T2 is coupled to the first node N1.

A gate of the third transistor T3 is coupled to the third scanning terminal Scan3, a first electrode of the third transistor T3 is coupled to the second power terminal VSS, and a second electrode of the third transistor T3 is coupled to the fourth node N4.

A gate of the fourth transistor T4 is coupled to the second scanning terminal Scan2, a first electrode of the fourth transistor T4 is coupled to the third node N3, and a second electrode of the fourth transistor T4 is coupled to the second node N2.

A gate of the fifth transistor T5 is coupled to the light-emitting control terminal EM, a first electrode of the fifth transistor T5 is coupled to the first power terminal VDD, and a second electrode of the fifth transistor T5 is coupled to the third node N3.

A gate of the sixth transistor T6 is coupled to the second node N2, a first electrode of the sixth transistor T6 is coupled to the third node N3, and a second electrode of the sixth transistor T6 is coupled to the fourth node N4.

One end of the first capacitor C1 is coupled to the first node N1, and the other end of the first capacitor C1 is coupled to the second node N2.

One end of the second capacitor C2 is coupled to the second node N2, and the other end of the second capacitor C2 is coupled to the fourth node N4.

It should be noted that the transistors used in the embodiments of the present disclosure may be field-effect transistors or other devices having the same characteristics, and the transistors used in the embodiments of the present disclosure are mainly switching transistors according to their roles in circuits. For the first electrode and the second electrode of a transistor, one electrode is referred to as a source and the other electrode is referred to as a drain. It is provided according to the form in the drawings that the middle terminal of a transistor is the gate, the signal input terminal is the first electrode, and the signal output terminal is the second electrode. In addition, the transistors used in the embodiments of the present disclosure may include any one of a P-type transistor and an N-type transistor. For a P-type transistor, the first potential (i.e., the active potential) may be a low potential relative to the second potential (i.e., the inactive potential), that is, the P-type transistor is conducted when the potential of the gate is a low potential and is cut off when the potential of the gate is a high potential. For an N-type transistor, the first potential (i.e., the active potential) may be a high potential relative to the second potential (i.e., the inactive potential), that is, the N-type transistor is conducted when the potential of the gate is a high potential and is cut off when the potential of the gate is a low potential. In addition, various signals in the embodiments of the present disclosure may correspond to an active potential and an inactive potential, and the active potential and the inactive potential represent only two state parameters of the potential of the signal and do not indicate that the potential has a specific value. The embodiments of the present disclosure are illustrated with each of the transistors being an N-type transistor.

It should be noted that the pixel circuit described in the embodiments of the present disclosure may have other structures in addition to the 6T2C structure (i.e., including six transistors and two capacitors) shown in FIG. 7, provided that two capacitors shown in FIG. 7 are included, such as a 5T2C structure.

Figure 8:
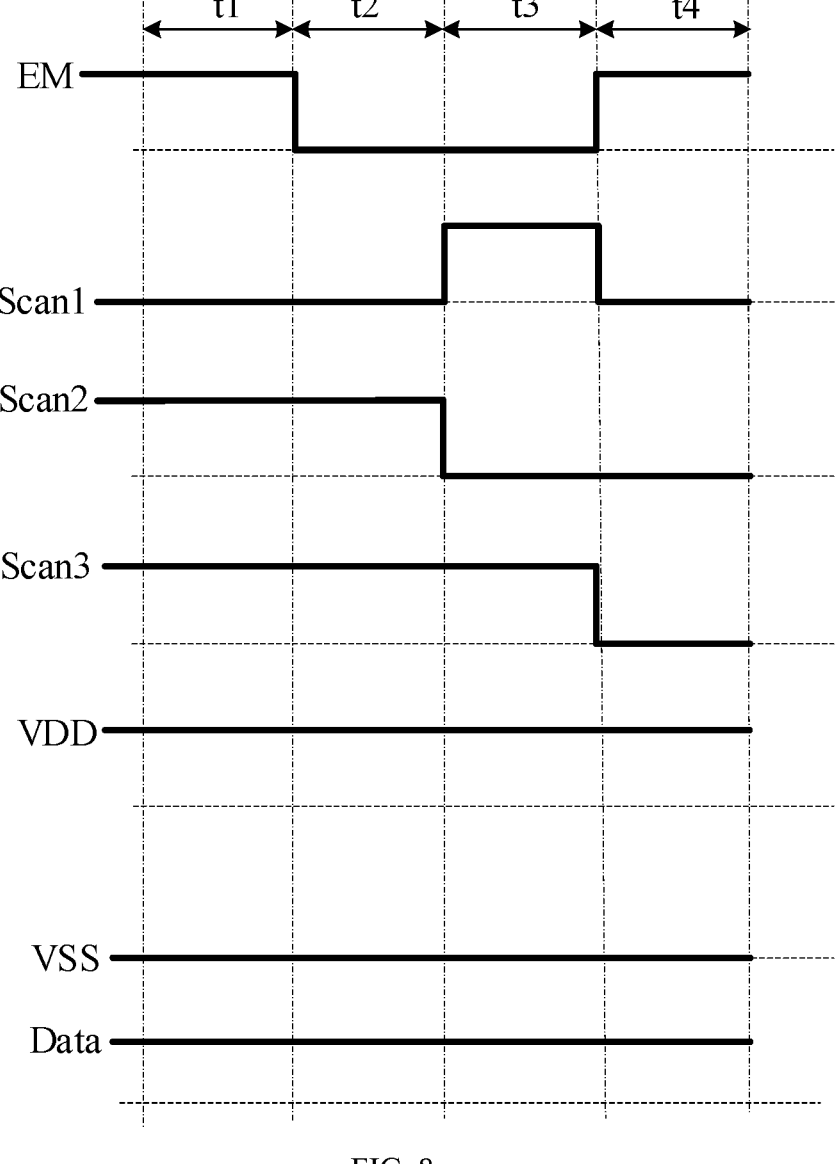
FIG. 8 is a timing diagram of signal terminals coupled in a pixel circuit according to some embodiments of the present disclosure.

Taking each of the transistors in the pixel circuit shown in FIG. 7 being an N-type transistor (that is, the first potential is a high potential and the second potential is a low potential) as an example, the working principle of the pixel circuit described in the embodiments of the present disclosure is described as follows:

For example, FIG. 8 shows a signal timing diagram of signal terminals coupled in a pixel circuit. As shown in FIG. 8, the entire process of driving the light-emitting element by the pixel circuit includes four stages performed in sequence: t1 to t4. At stages t1 to t4, the potential of the first power signal provided by the first power terminal VDD is maintained at the first potential, i.e., a high potential. The potential of the second power signal provided by the second power terminal VSS is maintained at the second potential, i.e., a low potential. The data signal terminal Data continuously provides a data signal of a certain potential.

At stage t1, the potential of the light-emitting control signal provided by the light-emitting control terminal EM, the potential of the second scanning signal provided by the second scanning terminal Scan2, and the potential of the third scanning signal provided by the third scanning terminal Scan3 are all the first potentials. The potential of the first scanning signal provided by the first scanning terminal Scan1 is the second potential. On this basis, the second transistor T2, the third transistor T3, the fourth transistor T4, and the fifth transistor T5 are all turned on, and the first transistor T1 is turned off. Accordingly, the second power signal provided by the second power terminal VSS may be transmitted to the first node N1 through the turned-on second transistor T2 and may be transmitted to the fourth node N4 through the turned-on third transistor T3 to reset the first node N1 and the fourth node N4, respectively. The first power signal provided by the first power terminal VDD may be transmitted to the third node N3 through the turned-on fifth transistor T5 to precharge the third node N3. In addition, the first power signal potential transmitted to the third node N3 may be transmitted to the second node N2 through the turned-on fourth transistor T4 to precharge the second node N2, such that the sixth transistor T6 is turned on in advance. Accordingly, stage t1 may also be referred to as an inverting & pre-charging stage.

For example, assuming that the potential of the first power signal is Vdd and the potential of the second power signal is 0, after stage t1, the potential $V_{N1}$ of the first node N1 and the potential $V_{N4}$ of the fourth node N4 are both 0, i.e., $V_{N1}=V_{N4}=0$, and the potential $V_{N2}$ of the second node N2 and the potential $V_{N3}$ of the third node N3 are both Vdd, i.e., $V_{N2}=V_{N3}=Vdd$.

At stage t2, the potential of the second scanning signal provided by the second scanning terminal Scan2 and the potential of the third scanning signal provided by the third scanning terminal Scan3 are both the first potential, and the potential of the light-emitting control signal provided by the light-emitting control terminal EM and the potential of the first scanning signal provided by the first scanning terminal Scan1 are both the second potential. On this basis, the second transistor T2 and the third transistor T3 are both turned on, the first transistor T1 and the fifth transistor T5 are both turned off, and the sixth transistor T6 is still turned on. The second power signal provided by the second power terminal VSS may continue to be transmitted to the first node N1 through the turned-on second transistor T2, and may continue to be transmitted to the fourth node N4 through the turned-on third transistor T3. Moreover, as the fifth transistor T5 is turned off and the fourth transistor T4 is still turned on, the potential transmitted to the second node N2 at stage t1 is released through the sixth transistor T6 until the potential of the second node N2 is equal to the threshold voltage Vth of the sixth transistor T6, thereby locking the threshold voltage Vth of the sixth transistor T6. Accordingly, stage t2 may also be referred to as a Vth locking stage.

For example, assuming that the potential of the second power signal is 0, after stage t2, the potential $V_{N1}$ of the first node N1 and the potential $V_{N4}$ of the fourth node N4 are still both 0, i.e., $V_{N1}=V_{N4}=0$, and the potential $V_{N2}$ of the second node N2 is equal to Vth, i.e., $V_{N2}=Vth$.

At stage t3, the potential of the first scanning signal provided by the first scanning terminal Scan1 and the potential of the third scanning signal provided by the third scanning terminal Scan3 are both the first potential, and the potential of the light-emitting control signal provided by the light-emitting control terminal EM and the potential of the second scanning signal provided by the second scanning terminal Scan2 are both the second potential. On this basis, the first transistor T1 and the third transistor T3 are both turned on, and the second transistor T2, the fourth transistor T4, and the fifth transistor T5 are all turned off. Accordingly, the data signal provided by the data signal terminal Data may be transmitted to the first node N1 through the turned-on first transistor T1 to charge the first node N1. The second power signal provided by the second power terminal VSS may continue to be transmitted to the fourth node N4 through the turned-on third transistor T3. Accordingly, stage t3 may also be referred to as a data writing stage.

For example, assuming that the potential of the second power signal is 0, the potential of the data signal is Vdata, the capacitance of the first capacitor C1 is c1, and the capacitance of the second capacitor C2 is c2, after stage t3, the potential $V_{N1}$ of the first node N1 is Vdata, i.e., $V_{N1}=Vdata$. The potential $V_{N4}$ of the fourth node N4 is still 0, i.e., $V_{N4}=0$. As the second node N2 floats between the first capacitor C1 and the second capacitor C2, the potential $V_{N2}$ of the second node N2 may satisfy: $V_{N2}=Vth+c1/(c1+c2)\times Vdata$, under the capacitance coupling effect, and the sixth transistor T6 is still turned on. Meanwhile, as the potential $V_{N4}$ of the fourth node N4 is 0, the voltage difference between one end and the other end of the second capacitor C2 is: $Vth+c1/(c1+c2)\times Vdata$, which is continuously held until the next frame.

At stage t4, the potential of the light-emitting control signal provided by the light-emitting control terminal EM is the first potential, and the potential of the first scanning signal provided by the first scanning terminal Scan1, the potential of the second scanning signal provided by the second scanning terminal Scan2, and the potential of the third scanning signal provided by the third scanning terminal Scan3 are all the second potentials. On this basis, the first transistor T1, the second transistor T2, the third transistor T3, and the fourth transistor T4 are all turned off, and only the fifth transistor T5 and the sixth transistor T6 are still turned on. Accordingly, a series connection circuit is formed by the first power terminal VDD, the fifth transistor T5, the sixth transistor T6, the light-emitting element L1, and the second power terminal VSS. The first power signal provided by the first power terminal VDD is transmitted to the third node N3 through the turned-on fifth transistor T5, and the sixth transistor T6 may transmit a drive signal (i.e., a drive current) to the fourth node N4 based on the potentials of the second node N2 and the third node N3, and the light-emitting element L1 emits light under the potential difference between the drive signal and the second power signal provided by the second power terminal VSS.

For example, assuming that the potential of the second power signal is 0, the potential of the data signal is Vdata, the capacitance of the first capacitor C1 is c1, and the capacitance of the second capacitor C2 is c2, the drive current $I_D$s finally transmitted to the light-emitting element L1 by the pixel circuit P1 may be expressed as:

$$I_{DS} = \frac{1}{2}\mu_n C_{OX}\left(\frac{W}{L}\right)(V_{p2} - V_{p4} - V_{th})^2 = \qquad \text{formula (1)}$$

$$\frac{1}{2}\mu_n C_{OX}\left(\frac{W}{L}\right)\left(\frac{c1}{c1+c2}V_{data}\right)^2;$$

wherein $\mu$ is a carrier mobility of the sixth transistor T6, COX is a capacitance of a gate insulating layer of the sixth transistor T6, and W/L is a width-to-length ratio of the sixth transistor T6, which are all constants associated with process design of the sixth transistor T6. As can be seen, in the case that the light-emitting element L1 normally operates, the magnitude of the drive current for driving the light-emitting element L1 is independent of the threshold voltage Vth of a drive transistor T0, and is dependent on the capacitance c1 of the first capacitor C1, the capacitance c2 of the second capacitor C2, and the potential Vdata of the data signal.

In the case that the display panel displays a picture of a target gray level, the potential Vdata of the data signal is generally fixed, and thus the regional setting cannot be achieved, and the capacitance c2 of the second capacitor C2 is generally fixed, so as to reliably maintain the potentials of the second node N2 and the fourth node N4. That is, in each of the second pixels 03, the capacitance c2 of the second capacitor C2 in the pixel circuit P1 may be equal. Therefore, in the embodiments of the present disclosure, each of the pixel circuits P1 can still output drive currents $I_{DS}$ with different magnitudes under the same data signal potential Vdata by adjusting the capacitance c1 of the first capacitor C1, so as to achieve the purpose of adjusting the luminance brightness of the second pixel 03.

In some embodiments, in the embodiments of the present disclosure, the capacitance c1 of the first capacitor C1 is a target multiple of the capacitance c2 of the second capacitor C2, and the target multiple is greater than 0 and less than or equal to 1. Moreover, for each of the second pixels 03, the target multiple may be associated with the distance from the second pixel 03 to the special-shaped edge. That is, for each of the second pixels 03, the capacitance of the first capacitor C1 may be smaller than that of the second capacitor C2, and the capacitance of the first capacitor C1 and the distance from the second pixel 03 to the special-shaped edge satisfy a certain relationship, such that the potentials of the drive signals transmitted to the light-emitting elements L1 by the pixel circuits P1 in the second pixels 03 with different distances from the special-shaped edge among the plurality of second pixels 03 may be different.

For example, for each of the second pixels 03, the target multiple may be positively correlated with the distance from the second pixel 03 to the special-shaped edge, such that the potential of the drive signal transmitted to the light-emitting element L1 by the pixel circuit P1 in the second pixel 03 is positively correlated with the distance from the second pixel to the special-shaped edge. In other words, in the plurality of second pixels 03, for the second pixels 03 closer to the special-shaped edge, the target multiple may be smaller, and the capacitance of the first capacitor C1 may be smaller; and for the second pixels 03 farther from the special-shaped edge, the target multiple may be larger, and the capacitance of the first capacitor C1 may be larger. The smaller the capacitance of the first capacitor C1 is, the smaller the potential of the drive signal transmitted to the light-emitting element L1 by the pixel circuit P1 is, and the darker the luminance brightness of the light-emitting element L1 is, and in addition, the larger the capacitance of the first capacitor C1 is, the larger the potential of the drive signal transmitted to the light-emitting element L1 by the pixel circuit P1 is, and the brighter the luminance brightness of the light-emitting element L1 is.

For example, for the embodiments in FIGS. 2 and 3 in which the plurality of second pixels 03 are partitioned into a plurality of pixel groups Z1, and the luminance brightness of the second pixels 03 gradually decreases along the direction from the main display region A12 to the special-shaped edge, the capacitances of the first capacitors C1 of the pixel circuits P1 in the second pixels 03 in each of the pixel groups Z1 may be set to gradually decrease along the direction from the main display region A12 to the special-shaped edge, and the capacitances of the first capacitors C1 of the pixel circuits P1 in the second pixels 03 in each of the pixel groups Z1 may be set to be equal, so as to achieve the purpose of gradually decreasing the luminance brightness.

In addition, for the embodiments in which the decreasing magnitudes are the same, the decreasing magnitudes of the capacitances of the first capacitors C1 of the pixel circuits P1 in the second pixels 03 in the respective pixel groups Z1 may be the same.

For example, the above formula (1) may be simplified as the following formula (2):

$$I_{DS} = \frac{1}{2}\mu_n A \left(\frac{c1}{c1+c2}\right)^2; \qquad \text{formula (2)}$$

Based on the above formula (2), assuming that the capacitance c2 of the second capacitor C2 is 1 picofarad (pF), in the case that the target gray level is L255 and the drive current $I_DS$ is 0.25 amperes (A), the capacitance c1 of the first capacitor C1 should be equal to c2 by substituting the variables into the above formula (2), i.e., c1=c2=1 pF. In the main display region A12, the capacitance c1 of the first capacitor C1 and the capacitance c2 of the second capacitor C2 in each of the first pixels 02 may satisfy the design.

Figure 9:
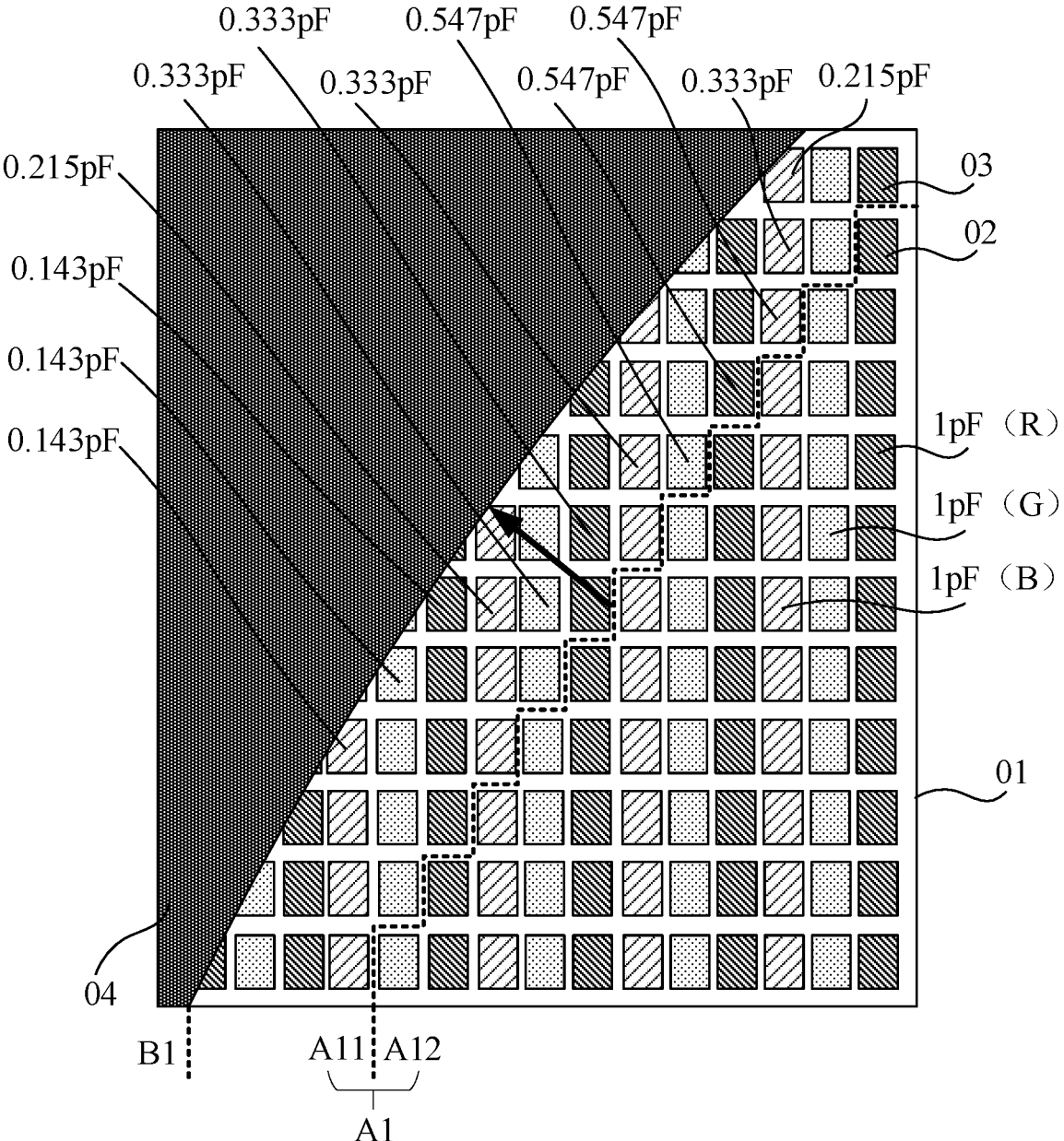
FIG. 9 is a schematic structural diagram of yet another display panel according to some embodiments of the present disclosure.

Referring to FIGS. 3 and 9, in the case that the display gray levels of respective second pixels 03 in a first pixel group Z1 need to be reduced to L127 along the direction from the main display region A12 to the special-shaped edge, the drive current $I_{DS}$ accordingly needs to be reduced to 0.125 A, and by substituting the variables into the above formula (2), the capacitance c1 of the first capacitor C1 should be reduced to 0.547 times of the capacitance c2 of the second capacitor C2, that is, the target multiple is 0.547, and c1=0.547c2=0.547 pF.

In the case that the display gray levels of respective second pixels 03 in a second pixel group Z1 need to be reduced to L64, the drive current $I_{DS}$ accordingly needs to be reduced to 0.063 A, and by substituting the variables into the above formula (2), the capacitance c1 of the first capacitor C1 should be reduced to 0.333 times of the capacitance c2 of the second capacitor C2, that is, the target multiple is 0.333, and c1=0.333c2=0.333 pF.

In the case that the display gray levels of respective second pixels 03 in a third pixel group Z1 need to be reduced to L32, the drive current $I_{DS}$ accordingly needs to be reduced to 0.0313 A, and by substituting the variables into the above formula (2), the capacitance c1 of the first capacitor C1 should be reduced to 0.215 times of the capacitance c2 of the second capacitor C2, that is, the target multiple is 0.215, and c1=0.215c2=0.215 pF.

In the case that the display gray levels of respective second pixels 03 in a fourth pixel group Z1 need to be reduced to L16, the drive current $I_{DS}$ accordingly needs to be reduced to 0.0156 A, and by substituting the variables into the above formula (2), the capacitance c1 of the first capacitor C1 should be reduced to 0.143 times of the capacitance c2 of the second capacitor C2, that is, the target multiple is 0.143, and c1=0.143c2=0.143 pF.

Figure 10:
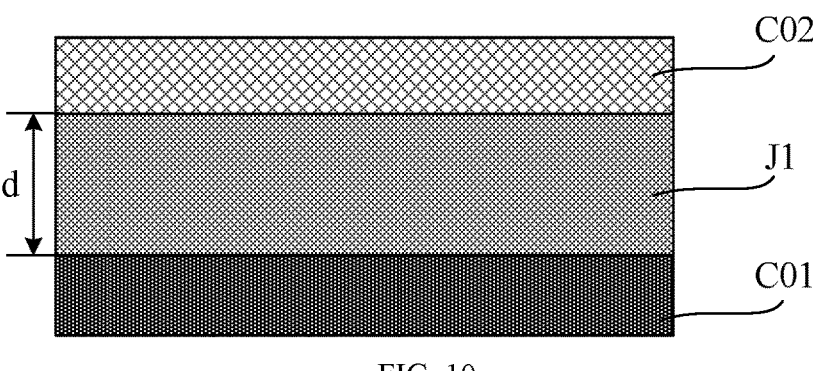
FIG. 10 is a schematic cross-sectional view of a capacitor according to some embodiments of the present disclosure.
Figure 11:
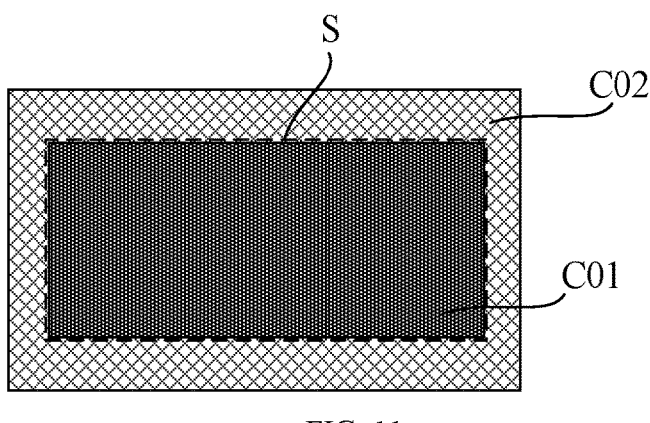
FIG. 11 is a top view of an upper plate and a lower plate overlapping in a capacitor according to some embodiments of the present disclosure.

Referring to FIG. 10, in the embodiments of the present disclosure, each of the first capacitor C1 and the second capacitor C2 includes: a first electrode plate C01 (i.e., a lower plate), an insulating layer J1, and a second electrode plate C02 (i.e., an upper plate) which are sequentially stacked along a direction distal from the base substrate 01, and an orthographic projection of the first electrode plate C01 on the base substrate 01 is overlapped with an orthographic projection of the second electrode plate C02 on the base substrate 01. FIG. 11 shows an overlapping top view and identifies an overlapping area S.

The capacitance c of the capacitor satisfies the following calculation formula:

$$"c = \varepsilon \frac{S}{d}"$$

where $\varepsilon$ is a dielectric constant of the insulating layer J1, S is an overlapping area between the first electrode plate C01 and the second electrode plate C02, and d is a distance between the first electrode plate C01 and the second electrode plate C02, that is, the thickness of the insulating layer J1.

In the manufacturing process of the display panel, the thickness and the material of the insulating layer J1 are generally fixed due to design constraints, and accordingly, $\varepsilon$ and d are fixed. Based on this, in the embodiments of the present disclosure, the capacitance c1 of the first capacitor C1 may be set by changing the overlapping area S between the upper plate and the lower plate. That is, the capacitance c1 of the first capacitor C1 is the same as the overlapping area S between the upper plate and the lower plate.

That is, in each of the second pixels 03 described in the embodiments of the present disclosure, the dielectric constant c of the insulating layers J1 in the first capacitor C1 and the second capacitor C2 may be the same, the distances d between the first electrode plates C01 and the second electrode plates C02 in the first capacitor C1 and the second capacitor C2 may be equal, and the overlapping area S between the first electrode plate C01 and the second electrode plate C02 in the first capacitor C1 may be a target multiple of the overlapping area S between the first electrode plate C01 and the second electrode plate C02 in the second capacitor C2. That is, along the direction from the main display region A12 to the special-shaped edge, the overlapping area S between the first electrode plate C01 and the second electrode plate C02 in the first capacitor C1 in the second pixel 03 may be positively correlated with the distance from the second pixel to the special-shaped edge, and the smaller the distance is, the smaller the overlapping area is; and conversely, the larger the distance is, the larger the overlapping area is.

For example, based on the embodiments in which the plurality of second pixels 03 are partitioned into a plurality of pixel groups Z1 and the luminance brightness of the second pixels 03 gradually decreases along the direction from the main display region A12 to the special-shaped edge, along the direction from the main display region A12 to the special-shaped edge, for the second pixels 03 in the respective pixel groups Z1, the overlapping area S between the upper plate and the lower plate of the first capacitor C1 may gradually decrease and is in a multiple relationship with the overlapping area S between the upper plate and the lower plate of the second capacitor C2. For the second pixels 03 in each of the pixel groups Z1, the overlapping area S between the upper plate and the lower plate of the first capacitor C1 may be the same.

For example, taking the embodiments of FIG. 9 as an example, in the case that the capacitance c2 of the second capacitor C2 is fixed, for the second pixels 03 of the pixel groups Z1 sequentially arranged along the direction from the main display region A12 to the special-shaped edge, the overlapping areas S between the upper plate and the lower plate of the first capacitor C1 may be: 0.547 times, 0.333 times, 0.215 times, and 0.143 times of the overlapping area S between the upper plate and the lower plate of the second capacitor C2. In the main display region A12, the overlapping area S between the upper plate and the lower plate of the first capacitor C1 in the first pixel 02 may be 1 time of the overlapping area S between the upper plate and the lower plate of the second capacitor C2.

Figure 12:
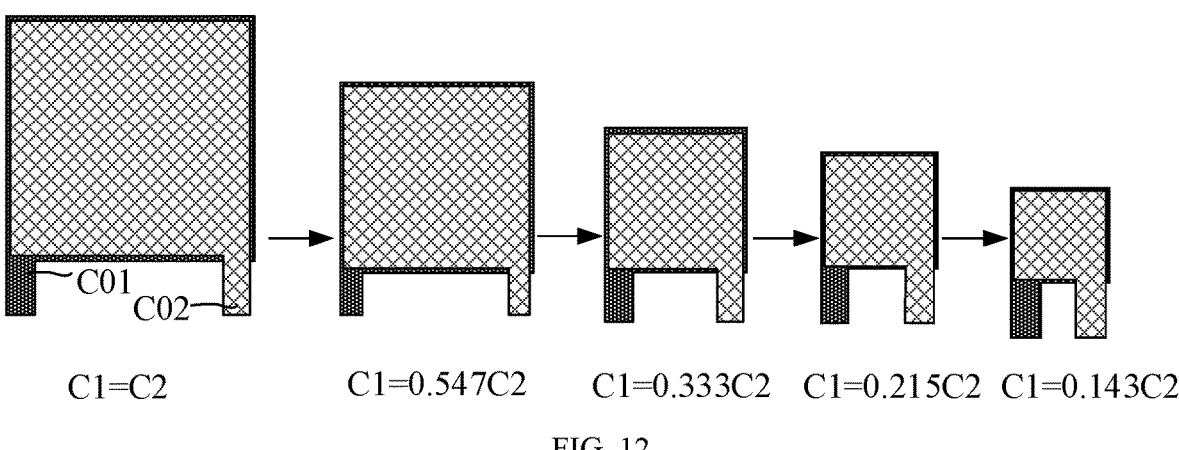
FIG. 12 is a schematic diagram of capacitor design according to some embodiments of the present disclosure.

As the overlapping area S between the first electrode plate C01 and the second electrode plate C02 is associated with the area of the first electrode plate C01 and the area of the second electrode plate C02, the embodiments of the present disclosure provide the following design modes:

An alternative implementation: referring to FIG. 12, the area of the first electrode plate C01 in the first capacitor C1 is a target multiple of the area of the first electrode plate C01 in the second capacitor C2, and the area of the second electrode plate C02 in the first capacitor C1 is a target multiple of the area of the second electrode plate C02 in the second capacitor C2. That is, the capacitance c1 of the first capacitor C1 may be designed by setting both the area of the first electrode plate C01 and the area of the second electrode plate C02 to be a target multiple of the area of the corresponding electrode plate in the second capacitor C2 based on the distance between the second pixel 03 and the special-shaped edge. Based on the embodiments in which the overlapping area S between the upper plate and the lower plate of the first capacitor C1 for the second pixels 03 in the respective pixel groups Z1 along the direction from the main display region A12 to the special-shaped edge gradually decreases, the implementation may be considered as follows: the area of the first electrode plate C01 and the area of the second electrode plate C02 gradually decrease.

Figure 13:
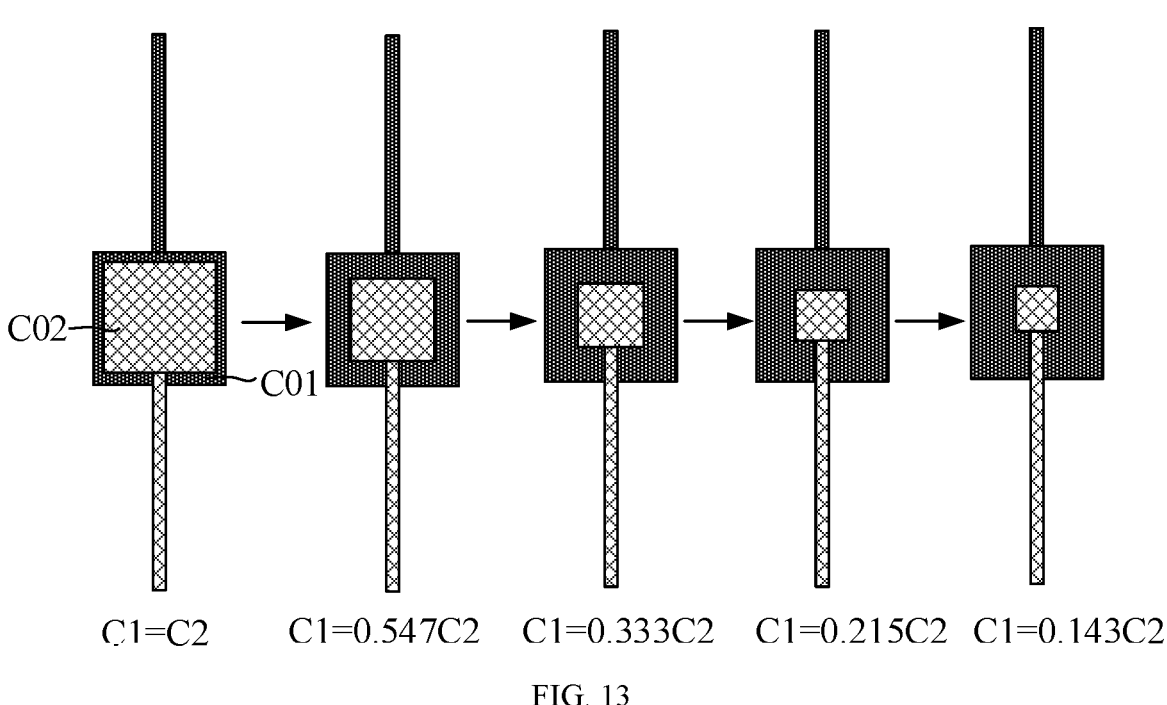
FIG. 13 is a schematic diagram of another capacitor design according to some embodiments of the present disclosure.
Figure 14:
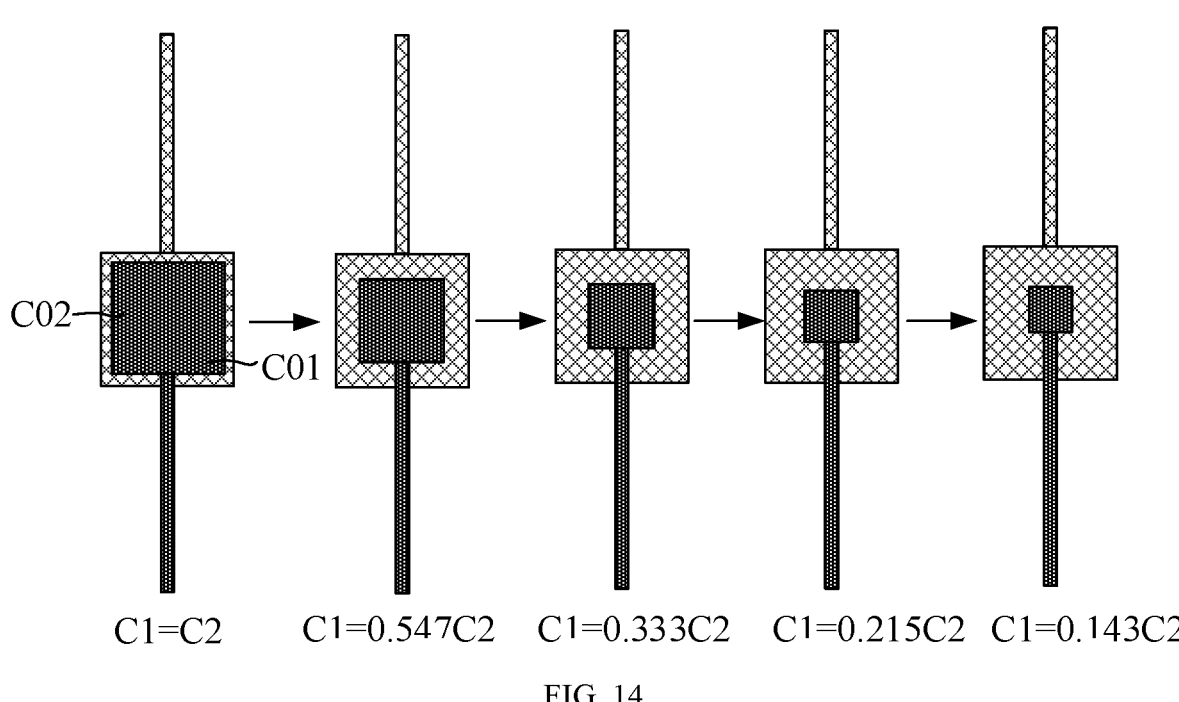
FIG. 14 is a schematic diagram of capacitor design according to some embodiments of the present disclosure.

Another alternative implementation: referring to FIGS. 13 and 14, for the first electrode plate C01 and the second electrode plate C02 in the first capacitor C1, the area of one electrode plate may be the same as the area of one electrode plate of the first electrode plate C01 and the second electrode plate C02 in the second capacitor C2, and the area of the other electrode plate may be a target multiple of the area of the other electrode plate of the first electrode plate C01 and the second electrode plate C02 in the second capacitor C2. That is, the capacitance c1 of the first capacitor C1 may be designed by setting the area of the first electrode plate C01 or the area of the second electrode plate C02 to be a target multiple of the area of the corresponding electrode plate in the second capacitor C2 based on the distance between the second pixel 03 and the special-shaped edge. Based on the embodiments in which the overlapping area S between the upper plate and the lower plate of the first capacitor C1 for the second pixels 03 in the respective pixel groups Z1 along the direction from the main display region A12 to the special-shaped edge gradually decreases, the implementation may be considered as follows: the area of the first electrode plate C01 or the area of the second electrode plate C02 gradually decreases.

For example, the implementation shown in FIG. 13 is as follows: along the direction from the main display region A12 to the special-shaped edge, the area of the first electrode plate C01 is fixed, and the area of the second electrode plate C02 gradually decreases. That is, in the first capacitor C1 and the second capacitor C2, one electrode plate is the first electrode plate C01, and the other electrode plate is the second electrode plate C02. The first electrode plate C01 is disposed on the side closest to the base substrate 01, and thus is also generally configured to shield light. Therefore, the good shading effect can be ensured on the basis of achieving the capacitance setting based on the distance by setting the area of the first electrode plate C01 to be fixed (i.e., not gradually decrease). The implementation shown in FIG. 14 is as follows: along the direction from the main display region A12 to the special-shaped edge, the area of the first electrode plate C01 gradually decreases, and the area of the second electrode plate C02 is fixed. That is, in the first capacitor C1 and the second capacitor C2, one electrode plate is the second electrode plate C02, and the other electrode plate is the first electrode plate C01.

In some embodiments, FIGS. 12 to 14 are all taken as examples in the manner shown in FIG. 9, and sequentially show that the overlapping areas S between the first electrode plate C01 and the second electrode plate C02 in the first capacitor C1 from left to right are: C2, 0.547C2, 0.333C2, 0.215C2, and 0.143C2, respectively, wherein C2 is configured to indicate the overlapping area between the first electrode plate C01 and the second electrode plate C02 in the second capacitor C2.

In some embodiments, in the embodiments of the present disclosure, each of the first pixel 02 and the second pixel 03 generally includes: a gate (G) metal layer and a source-drain (SD) metal layer which are sequentially stacked along the direction distal from the base substrate 01. In the first capacitor C1 and the second capacitor C2, the first electrode plate C01 may be disposed at the same layer as the gate (G) metal layer, and the second electrode plate C02 may be disposed at the same layer as the source-drain (SD) metal layer.

The same layer may refer to a layered structure formed by firstly forming a film layer configured to form specific patterns through the same film forming process and then patterning the film layer through a single patterning process by using the same mask plate. Depending on the specific pattern, a patterning process involves multiple exposures, development, or etching process, and the specific patterns formed in the layered structure are either continuous or discontinuous. That is, a plurality of elements, components, structures, and/or portions disposed "at the same layer" are made of the same material and formed through the same patterning process. This allows for saving on manufacturing processes and costs and increases the manufacturing efficiency. That is, in the embodiments of the present disclosure, the first electrode plate C01 and the gate (G) metal layer may be formed through a single patterning process by using the same material. In addition, the second electrode plate C02 and the source-drain (SD) metal layer may be formed through a single patterning process by using the same material.

In some embodiments, both the material of the first electrode plate C01 and the material of the second electrode plate C02 include: copper (Cu) or aluminum (Al). The material of the insulating layer J1 includes: silicon nitride (SiNx) and/or silicon oxide (SiOx).

It should be noted that, in the above embodiments, the purpose of adjusting the drive current is achieved by fixing the capacitance c2 of the second capacitor C2 and adjusting the capacitance c1 of the first capacitor C1. In some embodiments, the purpose of adjusting the drive current may also be achieved by fixing the capacitance c1 of the first capacitor C1 and adjusting the capacitance c2 of the second capacitor C2. Alternatively, the purpose of adjusting the drive current is achieved by changing the capacitance c1 of the first capacitor C1 and the capacitance c2 of the second capacitor C2 at the same time. In any way, the adjustment principle shown in FIGS. 3 and 9 may be adopted to make the luminance brightness of the adjusted second pixels 03 gradually decrease along the direction approaching the special-shaped edge.

As can be seen from the above embodiments, in the embodiments of the present disclosure, the drive current transmitted to the light-emitting element L1 by the pixel circuit P1 is adjusted by designing the capacitance of the first capacitor C1 in the pixel circuit P1, such that the luminance brightness of the second pixels 03 in the special-shaped edge region A11 gradually decreases along the direction approaching the special-shaped edge, and the edge is subjected to the display processing in a blurred manner, thereby reducing the risk of rainbow stripes appearing on the edge.

In summary, the embodiments of the present disclosure provide a display panel. The display panel includes a base substrate, a plurality of first pixels, and a plurality of second pixels. The base substrate is provided with a special-shaped display region, and the special-shaped display region is partitioned into a special-shaped edge region and a main display region which are sequentially arranged along the direction distal from the special-shaped edge. The first pixels are disposed in the main display region. The second pixels are disposed in the special-shaped edge region. As in the case that the display panel displays a picture of a target gray level, the potentials of the drive signals transmitted to the light-emitting elements by the pixel circuits in the second pixels with different distances from the special-shaped edge are different and are smaller than the potentials of the drive signals transmitted to the light-emitting elements by the pixel circuits in the first pixels, the luminance brightness of the second pixels at different distance positions from the special-shaped edge gradually changes, and the maximum luminance brightness of the second pixels is smaller than the luminance brightness of the first pixels. And then, the problem of rainbow stripes caused by uneven pixel arrangement can be avoided, thereby ensuring a good display effect.

Figure 15:
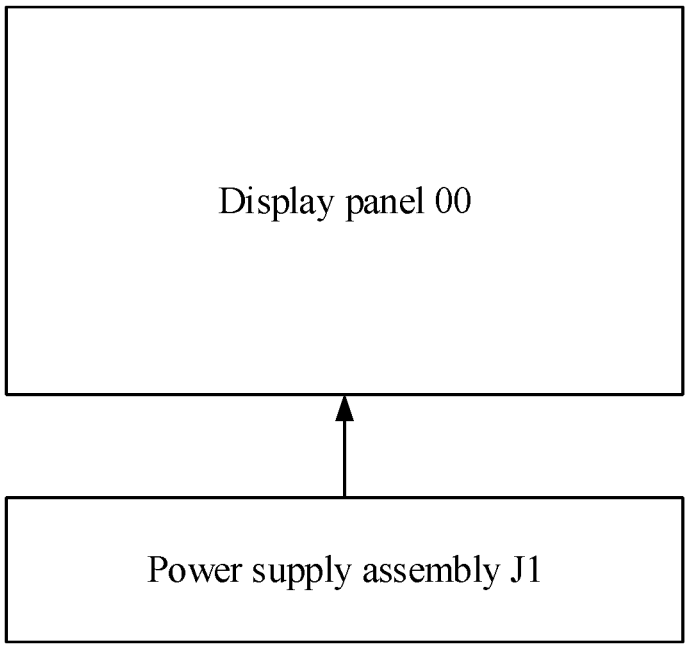
FIG. 15 is a schematic structural diagram of a display device according to some embodiments of the present disclosure.

FIG. 15 is a schematic structural diagram of a display device according to some embodiments of the present disclosure. As shown in FIG. 15, the display device includes: a power supply assembly J1, and the display panel 00 as shown in the above figures.

The power supply assembly J1 is coupled to the display panel 00 and configured to supply power to the display panel 00.

In some embodiments, the display device described in the embodiments of the present disclosure may be: any product or component with a display function, such as an OLED display device, a micro-LED display device, a mini LED display device, an instrument panel in an automobile, a smart watch, a wearable element, a mobile phone, a tablet computer, a flexible display device, or a television.

It should be noted that, in the accompanying drawings, the dimensions of the layers and regions may be exaggerated for clarity of illustration. Also, it can be understood that, in the case that an element or layer is referred to as being "on" another element or layer, it may be directly on the other element, or an intermediate layer may be present. In addition, it can be understood that, in a case that an element or layer is referred to as being "under" another element or layer, it may be directly under the other element, or one or more intermediate layers or elements may be present. In addition, it can also be understood that, in a case that a layer or element is referred to as being "between" two layers or elements, it may be the only layer between the two layers or elements, or one or more intermediate layers or elements may also be present. Like reference numerals refer to like elements throughout the present disclosure.

In addition, terms used in detailed description of the present disclosure are defined to merely explain the embodiments of the present disclosure and are not intended to limit the present disclosure. Unless otherwise defined, technical or scientific terms used in detailed description of the present disclosure should have the ordinary meanings as understood by those of ordinary skill in the art to which the present disclosure belongs.

For example, in the embodiments of the present disclosure, the terms "first" and "second" are used for descriptive purposes only and should not be construed as indicating or implying the relative importance. The term "a plurality of" refers to two or more, unless otherwise explicitly defined.

Likewise, the terms "a", "an" or other similar words do not indicate a limitation of quantity, but rather the presence of at least one.

The terms "include", "comprise" or other similar words indicate that the elements or objects stated before "include" or "comprise" encompass the elements or objects and equivalents thereof listed after "include" or "comprise", but do not exclude other elements or objects.

"Up", "down", "left", "right" or the like is only defined to indicate relative position relationship. In the case that the absolute position of the described object is changed, the relative position relationship may be changed accordingly.

"And/or" indicates that three relationships may be present. For example, A and/or B may indicate that only A is present, both A and B are present, and only B is present. The symbol "/" generally indicates an "or" relationship between the associated objects.

Described above are merely optional embodiments of the present disclosure and are not intended to limit the present disclosure. Any modifications, equivalents, improvements, and the like, made within the spirit and principle of the present disclosure, should be included in the protection scope of the present disclosure.

The invention claimed is:

1. A display panel, comprising: a base substrate, provided with a special-shaped display region, wherein the special-shaped display region comprises a special-shaped edge region and a main display region, the special-shaped edge region being proximal to a special-shaped edge of the special-shaped display region relative to the main display region; a plurality of first pixels, disposed on one side of the base substrate and disposed in the main display region; and a plurality of second pixels, disposed on one side of the base substrate and disposed in the special-shaped edge region; wherein a number of the plurality of second pixels is smaller than a number of the plurality of first pixels, and each of the plurality of first pixels and the plurality of second pixels comprises: a pixel circuit and a light-emitting element, the pixel circuit being coupled to the light-emitting element and being configured to transmit a drive signal to the light-emitting element to drive the light-emitting element to emit light; and in a case that the display panel displays a picture of a target gray level, potentials of the drive signals transmitted to the light-emitting elements by the pixel circuits in the second pixels with different distances from the special-shaped edge among the plurality of second pixels are different, and the potential of the drive signal transmitted to the light-emitting element by the pixel circuit in each of the second pixels is smaller than a potential of the drive signal transmitted to the light-emitting element by the pixel circuit in any of the first pixels; wherein the plurality of second pixels comprise: a plurality of pixel groups, wherein the plurality of pixel groups are sequentially arranged along a direction from the main display region to the special-shaped edge, and distances from the pixel groups to the special-shaped edge are different; the second pixels in each of the pixel groups are arranged in a step shape along an extending direction parallel to the special-shaped edge, and distances from the second pixels in each of the pixel groups to the special-shaped edge are equal; and in the case that the display panel displays the picture of the target gray level, potentials of the drive signals transmitted to the light-emitting elements by the pixel circuits in the second pixels in each of pixel groups are equal, and the potentials of the drive signals transmitted to the light-emitting elements by the pixel circuits in the second pixels in each of the pixel groups gradually decrease along the direction from the main display region to the special-shaped edge, such that display gray levels of the second pixels gradually decrease; and wherein in any two adjacent pixel groups, the potentials of the drive signals transmitted to the light-emitting elements by the pixel circuits in the second pixels gradually decrease according to a target decreasing value, such that along the direction from the main display region to the special-shaped edge, in each two adjacent pixel groups, a ratio of display gray levels of the second pixels in one pixel group to display gray levels of the second pixels in the other pixel group is a target ratio.

2. The display panel according to claim 1, wherein the target ratio is 1/2.

3. The display panel according to claim 1, wherein the pixel circuit comprises: a data writing circuit, a light-emitting control circuit, a potential adjustment circuit, and a drive circuit;

wherein the data writing circuit is coupled to a data signal terminal, a first scanning terminal, and a first node, respectively and is configured to control, in response to a first scanning signal provided by the first scanning terminal, on-off of the data signal terminal with the first node;

the light-emitting control circuit is coupled to a second scanning terminal, a light-emitting control terminal, a first power terminal, a second power terminal, the first node, a second node, and a third node, respectively and is configured to control, in response to a second scanning signal provided by the second scanning terminal, on-off of the second power terminal with the first node and on-off of the second node with the third node, and control, in response to a light-emitting control signal provided by the light-emitting control terminal, on-off of the first power terminal with the third node;

the potential adjustment circuit is coupled to the first node, the second node, and a fourth node, respectively and is configured to adjust potentials of the first node, the second node, and the fourth node;

the drive circuit is coupled to the second node, the third node, and the fourth node, respectively and is configured to transmit, based on the potentials of the second node and the third node, a drive signal to the fourth node; and the light-emitting element is coupled to the fourth node and the second power terminal respectively and is configured to emit light based on the potential of the fourth node and a second power signal provided by the second power terminal.

4. The display panel according to claim 3, wherein the potential adjustment circuit comprises: a first capacitor and a second capacitor;

wherein one end of the first capacitor is coupled to the first node, and the other end of the first capacitor is coupled to the second node; and one end of the second capacitor is coupled to the second node, and the other end of the second capacitor is coupled to the fourth node.

5. The display panel according to claim 4, wherein in the second pixels, capacitances of second capacitors are equal, a capacitance of the first capacitor is a target multiple of the capacitance of the second capacitor, the target multiple being less than or equal to 1; and for each of the second pixels, the target multiple is associated with the distance from the second pixel to the special-shaped edge, such that the potentials of the drive signals transmitted to the light-emitting elements by the pixel circuits in the second pixels with different distances from the special-shaped edge among the plurality of second pixels are different.

6. The display panel according to claim 5, wherein each of the first capacitor and the second capacitor comprises: a first electrode plate, an insulating layer, and a second electrode plate sequentially stacked along a direction distal from the base substrate, and an orthographic projection of the first electrode plate on the base substrate is overlapped with an orthographic projection of the second electrode plate on the base substrate; and in each of the second pixels, dielectric constants of the insulating layers in the first capacitor and the second capacitor are a same, distances between the first electrode plates and the second electrode plates in the first capacitor and the second capacitor are equal, and an overlapping area between the first electrode plate and the second electrode plate in the first capacitor is the target multiple of an overlapping area between the first electrode plate and the second electrode plate in the second capacitor.

7. The display panel according to claim 6, wherein an area of the first electrode plate in the first capacitor is the target multiple of an area of the first electrode plate in the second capacitor, and an area of the second electrode plate in the first capacitor is the target multiple of an area of the second electrode plate in the second capacitor.

8. The display panel according to claim 6, wherein for the first electrode plate and the second electrode plate in the first capacitor, an area of one electrode plate is a same as an area of one electrode plate of the first electrode plate and the second electrode plate in the second capacitor, and an area of the other electrode plate is the target multiple of an area of the other electrode plate of the first electrode plate and the second electrode plate in the second capacitor.

9. The display panel according to claim 8, wherein in the first capacitor and the second capacitor, the one electrode plate is the first electrode plate, and the other electrode plate is the second electrode plate.

10. The display panel according to claim 4, wherein the light-emitting control circuit is further coupled to a third scanning terminal and the fourth node and is configured to control, in response to a third scanning signal provided by the third scanning terminal, on-off of the second power terminal with the fourth node; the light-emitting control circuit comprises: a first reset sub-circuit, a second reset sub-circuit, a compensation sub-circuit, and a light-emitting control sub-circuit;

wherein the first reset sub-circuit is coupled to the second scanning terminal, the second power terminal, and the first node, respectively and is configured to control, in response to the second scanning signal, on-off of the second power terminal with the first node;

the second reset sub-circuit is coupled to the third scanning terminal, the second power terminal, and the fourth node, respectively and is configured to control, in response to the third scanning signal, on-off of the second power terminal with the fourth node;

the compensation sub-circuit is coupled to the second scanning terminal, the second node, and the third node, respectively and is configured to control, in response to the second scanning signal, on-off of the second node with the third node; and the light-emitting control sub-circuit is coupled to the light-emitting control terminal, the first power terminal, and the third node, respectively and is configured to control, in response to the light-emitting control signal, on-off of the first power terminal with the third node.

11. The display panel according to claim 10, wherein the data writing circuit comprises: a first transistor; the first reset sub-circuit comprises: a second transistor; the second reset sub-circuit comprises: a third transistor; the compensation sub-circuit comprises: a fourth transistor; the light-emitting control sub-circuit comprises: a fifth transistor; the drive circuit comprises: a sixth transistor;

wherein a gate of the first transistor is coupled to the first scanning terminal, a first electrode of the first transistor is coupled to the data signal terminal, and a second electrode of the first transistor is coupled to the first node;

a gate of the second transistor is coupled to the second scanning terminal, a first electrode of the second transistor is coupled to the second power terminal, and a second electrode of the second transistor is coupled to the first node;

a gate of the third transistor is coupled to the third scanning terminal, a first electrode of the third transistor is coupled to the second power terminal, and a second electrode of the third transistor is coupled to the fourth node;

a gate of the fourth transistor is coupled to the second scanning terminal, a first electrode of the fourth transistor is coupled to the third node, and a second electrode of the fourth transistor is coupled to the second node;

a gate of the fifth transistor is coupled to the light-emitting control terminal, a first electrode of the fifth transistor is coupled to the first power terminal, and a second electrode of the fifth transistor is coupled to the third node; and a gate of the sixth transistor is coupled to the second node, a first electrode of the sixth transistor is coupled to the third node, and a second electrode of the sixth transistor is coupled to the fourth node.

12. The display panel according to claim 1, wherein the base substrate is further provided with a non-display region adjacent to the special-shaped display region; and the display panel further comprises:

a black matrix layer, disposed on one side of the plurality of first pixels and the second pixels distal from the base substrate and disposed in the special-shaped display region and the non-display region.

13. A display device, comprising: a power supply assembly, and a display panel; wherein the power supply assembly is coupled to the display panel and is configured to supply power to the display panel; the display panel comprises: a base substrate, provided with a special-shaped display region, wherein the special-shaped display region comprises a special-shaped edge region and a main display region, the special-shaped edge region being proximal to a special-shaped edge of the special-shaped display region relative to the main display region; a plurality of first pixels, disposed on one side of the base substrate and disposed in the main display region; and a plurality of second pixels, disposed on one side of the base substrate and disposed in the special-shaped edge region; wherein a number of the plurality of second pixels is smaller than a number of the plurality of first pixels, and each of the plurality of first pixels and the plurality of second pixels comprises: a pixel circuit and a light-emitting element, the pixel circuit being coupled to the light-emitting element and being configured to transmit a drive signal to the light-emitting element to drive the light-emitting element to emit light; and in a case that the display panel displays a picture of a target gray level, potentials of the drive signals transmitted to the light-emitting elements by the pixel circuits in the second pixels with different distances from the special-shaped edge among the plurality of second pixels are different, and the potential of the drive signal transmitted to the light-emitting element by the pixel circuit in each of the second pixels is smaller than a potential of the drive signal transmitted to the light-emitting element by the pixel circuit in any of the first pixels; wherein the plurality of second pixels comprise: a plurality of pixel groups, wherein the plurality of pixel groups are sequentially arranged along a direction from the main display region to the special-shaped edge, and distances from the pixel groups to the special-shaped edge are different; the second pixels in each of the pixel groups are arranged in a step shape along an extending direction parallel to the special-shaped edge, and distances from the second pixels in each of the pixel groups to the special-shaped edge are equal; and in the case that the display panel displays the picture of the target gray level, potentials of the drive signals transmitted to the light-emitting elements by the pixel circuits in the second pixels in each of pixel groups are equal, and the potentials of the drive signals transmitted to the light-emitting elements by the pixel circuits in the second pixels in each of the pixel groups gradually decrease along the direction from the main display region to the special-shaped edge, such that display gray levels of the second pixels gradually decrease: wherein in any two adjacent pixel groups, the potentials of the drive signals transmitted to the light-emitting elements by the pixel circuits in the second pixels gradually decrease according to a target decreasing value, such that along the direction from the main display region to the special-shaped edge, in each two adjacent pixel groups, a ratio of display gray levels of the second pixels in one pixel group to display gray levels of the second pixels in the other pixel group is a target ratio.

14. The display device according to claim 13, wherein the target ratio is 1/2.

15. The display device according to claim 13, wherein the pixel circuit comprises: a data writing circuit, a light-emitting control circuit, a potential adjustment circuit, and a drive circuit;

wherein the data writing circuit is coupled to a data signal terminal, a first scanning terminal, and a first node, respectively and is configured to control, in response to a first scanning signal provided by the first scanning terminal, on-off of the data signal terminal with the first node;

the light-emitting control circuit is coupled to a second scanning terminal, a light-emitting control terminal, a first power terminal, a second power terminal, the first node, a second node, and a third node, respectively and is configured to control, in response to a second scanning signal provided by the second scanning terminal, on-off of the second power terminal with the first node and on-off of the second node with the third node, and control, in response to a light-emitting control signal provided by the light-emitting control terminal, on-off of the first power terminal with the third node;

the potential adjustment circuit is coupled to the first node, the second node, and a fourth node, respectively and is configured to adjust potentials of the first node, the second node, and the fourth node;

the drive circuit is coupled to the second node, the third node, and the fourth node, respectively and is configured to transmit, based on the potentials of the second node and the third node, a drive signal to the fourth node; and the light-emitting element is coupled to the fourth node and the second power terminal respectively and is configured to emit light based on the potential of the fourth node and a second power signal provided by the second power terminal.

16. The display device according to claim 15, wherein the potential adjustment circuit comprises: a first capacitor and a second capacitor;

wherein one end of the first capacitor is coupled to the first node, and the other end of the first capacitor is coupled to the second node; and one end of the second capacitor is coupled to the second node, and the other end of the second capacitor is coupled to the fourth node.

* * * * *